(12) United States Patent
Wang et al.

(10) Patent No.: US 11,785,325 B2
(45) Date of Patent: Oct. 10, 2023

(54) CAMERA MODULE HAVING CIRCUIT BOARD, MOLDED BASE, AND OPTICAL LENS, ELECTRONIC DEVICE HAVING SAME AND METHOD FOR MANUFACTURING CAMERA MODULE

(71) Applicant: NINGBO SUNNY OPOTECH CO., LTD., Zhejiang (CN)

(72) Inventors: Mingzhu Wang, Yuyao Ningbo (CN); Bojie Zhao, Yuyao Ningbo (CN); Zhewen Mei, Yuyao Ningbo (CN); Nan Guo, Yuyao Ningbo (CN); Lifeng Yao, Yuyao Ningbo (CN); Zhenyu Chen, Yuyao Ningbo (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 392 days.

(21) Appl. No.: 16/633,088

(22) PCT Filed: Aug. 3, 2018

(86) PCT No.: PCT/CN2018/098560
§ 371 (c)(1),
(2) Date: Jan. 22, 2020

(87) PCT Pub. No.: WO2019/029450
PCT Pub. Date: Feb. 14, 2019

(65) Prior Publication Data
US 2020/0162648 A1 May 21, 2020

(30) Foreign Application Priority Data

Aug. 5, 2017 (CN) .......................... 201710663413.1

(51) Int. Cl.
*H04N 23/57* (2023.01)
*B29D 11/00* (2006.01)
(Continued)

(52) U.S. Cl.
CPC ......... *H04N 23/57* (2023.01); *B29D 11/0048* (2013.01); *G02B 7/021* (2013.01);
(Continued)

(58) Field of Classification Search
CPC .. H04N 5/2257; H04N 5/2254; H04N 5/2253; H04N 23/54; H04N 23/55;
(Continued)

(56) References Cited

U.S. PATENT DOCUMENTS

2014/0036218 A1 2/2014 Yu
2014/0041214 A1* 2/2014 Barlow ............ H01L 27/14625
29/841

(Continued)

FOREIGN PATENT DOCUMENTS

CN 103296043 A 9/2013
CN 203674205 U 6/2014
(Continued)

OTHER PUBLICATIONS

Chinese Office Action and Search Report, dated Sep. 28, 2020, for Chinese Application No. 201880044841.9, with an English translation.

(Continued)

*Primary Examiner* — Antoinette T Spinks
(74) *Attorney, Agent, or Firm* — Birch, Stewart, Kolasch & Birch, LLP

(57) ABSTRACT

A camera module and an electronic device having the same, and a method for manufacturing the camera module, wherein the fixed-focus camera module comprises a circuit board; a photosensitive element, which is conductively connected to the circuit board; a molded base, wherein the molded base is integrally molded on the circuit board and the photosensitive element, and the molded base forms a light window, so as to provide a light passage for the photosen- (Continued)

sitive chip through the light window; and an optical lens, wherein the optical lens is supported on the molded base and corresponds to the light window formed by the molded base, wherein the circuit board comprises a circuit board substrate and at least one electronic component, wherein the at least one electronic component is electrically connected to the circuit board substrate, wherein the circuit board substrate has a blank side, and wherein the blank side of the circuit board substrate is free of the at least one electronic component.

18 Claims, 14 Drawing Sheets

(51) Int. Cl.
    *G02B 7/02*         (2021.01)
    *B29L 11/00*       (2006.01)
    *H05K 3/00*        (2006.01)
    *H04N 23/55*      (2023.01)

(52) U.S. Cl.
    CPC ....... *B29L 2011/0016* (2013.01); *H04N 23/55* (2023.01); *H05K 3/0014* (2013.01)

(58) Field of Classification Search
    CPC ........ H04N 23/57; G02B 7/021; G02B 7/003; B29D 11/0048; B29L 2011/0016; H05K 3/0014; H01L 27/14618; H01L 27/14625
    See application file for complete search history.

(56) References Cited

U.S. PATENT DOCUMENTS

| | | |
|---|---|---|
| 2016/0150133 A1 | 5/2016 | Suzuki et al. |
| 2016/0313520 A1 | 10/2016 | Shinohara et al. |
| 2016/0353029 A1 | 12/2016 | Hwang et al. |
| 2017/0142303 A1 | 5/2017 | Wang et al. |
| 2017/0353646 A1* | 12/2017 | Wang .................... H05K 1/182 |
| 2018/0035021 A1 | 2/2018 | Wang et al. |
| 2021/0329149 A1* | 10/2021 | Zhang .................. H04N 5/225 |

FOREIGN PATENT DOCUMENTS

| | | | |
|---|---|---|---|
| CN | 104469106 A | | 3/2015 |
| CN | 104836943 A | | 8/2015 |
| CN | 105187697 A | | 12/2015 |
| CN | 105467550 A | | 4/2016 |
| CN | 105516565 A | | 4/2016 |
| CN | 205176454 U | | 4/2016 |
| CN | 105611135 A | | 5/2016 |
| CN | 105721749 A | | 6/2016 |
| CN | 105847645 A | | 8/2016 |
| CN | 105898120 A | | 8/2016 |
| CN | 106131386 A | | 11/2016 |
| CN | 205792874 U | | 12/2016 |
| CN | 206074975 U | | 4/2017 |
| CN | 106973210 A | | 7/2017 |
| CN | 206302476 U | | 7/2017 |
| CN | 108322574 A | * | 7/2018 ........... G06F 1/1637 |
| JP | 2004-32141 A | | 1/2004 |
| JP | 2006-148473 A | | 6/2006 |
| JP | 2013-100573 A | | 5/2016 |
| KR | 10-2009-0116479 A | | 11/2009 |
| KR | 10-2013-0061539 A | | 6/2013 |
| TW | 201408060 A | | 2/2014 |
| WO | WO 2017/020751 A1 | | 2/2017 |
| WO | WO 2017/113549 A1 | | 7/2017 |

OTHER PUBLICATIONS

European Communication pursuant to Article 94(3) EPC for European Application No. 18843164.7, dated Dec. 20, 2021.
International Search Report (PCT/ISA/210) issued in PCT/CN2018/098560, dated Nov. 1, 2018.
Extended European Search Report for European Application No. 18843164.7, dated Mar. 7, 2020.

* cited by examiner

CAMERA MODULE HAVING CIRCUIT BOARD, MOLDED BASE, AND OPTICAL LENS, ELECTRONIC DEVICE HAVING SAME AND METHOD FOR MANUFACTURING CAMERA MODULE

CROSS REFERENCE TO RELATED APPLICATIONS

This application is a U.S. National Stage Application of International Patent Application No. PCT/CN2018/098560, filed Aug. 3, 2018, which claims priority to and benefit of China Patent Application No. 201710663413.1, filed Aug. 5, 2017, the contents of all of which are incorporated herein by reference in their entirety.

TECHNICAL FIELD

The present disclosure relates to the field of camera modules, and further relates to a camera module, an electronic device having the same and a method for manufacturing the camera module.

TECHNICAL BACKGROUND

With the development of science and technology, electronic products and smart devices have developed by leaps and bounds. The mainstream trend is that while electronic devices are increasingly thin and light, their comprehensive performance and user experience requirements are constantly updated and iterated. As one of indispensable components of the electronic products and smart devices, camera modules are also increasingly required to be multifunctional, thin, and miniaturized to meet the development trend of the electronic devices and smart products.

More specifically, the current electronic products, such as smart phones, are becoming thinner. In this technology trend, the height dimension (thickness dimension) of the camera module is compressed so that it can be completely received in an inner cavity of an electronic product's main body, which is one of necessary factors to be considered during design of a camera module structure. However, those skilled in the art should know that a high imaging quality and high performance camera module means a larger number of camera module components and a larger component size, which will inevitably cause the camera module after being assembled to have a large body size and not to meet the development trend of the current electronic devices.

On the other hand, in the user experience of electronic devices such as smart phones, having a larger screen will bring a lot of user experience friendliness. A large screen means that there is more room for video and image presentation, which gives a consumer a wider field of view. For example, when a user is experiencing a mobile phone application game, the operation experience of the large screen will undoubtedly bring huge experience advantages in terms of smart device hardware. However, the screen of smart devices cannot be expanded at will, and an oversized mobile phone screen will increase the overall size of the mobile phone, which will in turn affect carrying and one-handed operation. In other words, in the case of maintaining the overall size of existing electronic products such as smart phones to be relatively unchanged, increasing a screen ratio thereof, namely, increasing a ratio of a screen occupying an area surrounded by a border of a smart device is a preferred technical means by which the electronic products meet the consumer experience.

However, on the premise of increasing the screen ratio of electronic devices, the body size of the electronic components that cannot be removed on the same side of the screen needs to be as small as possible. Only in this way, a sufficient space can be reserved for the expansion of the ratio occupied by the screen. For example, for some smart phones, the front camera module is a core electronic component that cannot be removed. Therefore, in the process of increasing the smart phone screen ratio, the body size of the front camera module needs to be compressed, which can provide a space for the size expansion of the display screen of the electronic device.

As shown in FIG. 1, a fixed-focus camera module with a relatively large size package includes a circuit board 2, a photosensitive chip 3, a lens holder 1, and an optical lens 6. The circuit board 2 includes a plurality of electronic components 5 mounted on the circuit board, wherein the photosensitive chip 3 is conductively attached on a chip attaching area corresponding to the substrate of the circuit board 2 by means of a Chip on Board (COB), for example, by means of a gold wire. For a conventional lens holder, the lens holder 1 is mounted on the circuit board 2 and must leave a safe distance from the electronic components 5, the photosensitive chip 3 and their gold wires; and the lens holder 1, the electronic components 5 and the photosensitive chip 3 must leave a safe distance from each other. For a MOB camera module, it is necessary to leave a safe distance between the photosensitive chip and the lens holder. The lens holder 1 is mounted in a peripheral non-working area of the substrate of the circuit board 2 and a certain safety distance is provided between the lens holder 1 and the electronic components 5 assembled on the substrate of the circuit board 2, to prevent the occurrence of touch between the lens holder 1 and the electronic components 5 A. Further, the optical lens 6 is assembled on the top of the lens holder 1 and is held on the corresponding photosensitive path of the photosensitive element. Due to the limitation of the existing camera module's COB packaging process, the overall size of the finally produced camera module is difficult to meet the requirements.

For example, when the lens holder 1 is attached to the substrate of the circuit board 2, it is necessary to reserve a safe space for the electronic components 5 assembled on the circuit board 2 simultaneously in the horizontal direction and the height direction, so that the thickness dimension of the assembled camera module is relatively large. Secondly, since a safe space needs to be reserved in the horizontal direction, the circuit board 2 needs to extend an additional distance toward both sides. That is, since a safe space needs to be reserved in the horizontal direction, the length and width dimensions of the circuit board 2 need to be lengthened to meet the assembly design requirements. From another perspective, in the existing camera module, the circuit components are mounted on the circuit board 2 with a lower degree of intensity, that is, the space utilization ratio of the electronic components 5 on the circuit board 2 is relatively low.

Further, the optical lens 6 of the conventional camera module includes an inner lens barrel 62 for fixing a group of optical lens sheets 63 to the inner peripheral wall of the inner lens barrel 62 in a certain order, and the optical lens 6 generally includes a fixed lens barrel 61 coaxially disposed outside the inner lens barrel 62, to fix the optical lens 6 to the top of the lens holder 1 by the fixed lens barrel 61. Those skilled in the art should know that in the existing camera module, the light window opening formed by the lens holder 1 is relatively large, and in a case where the fixed lens barrel

61 is not provided, the optical lens 6 cannot be assembled on the top of the holder by its own width. In other words, in the existing camera module, the function of the fixed lens barrel 61 is equivalent to a beam, so as to bridge the lens holder 1 and the optical lens 6 for mounting, and it does not substantially affect the optical performance of the camera module. However, with the development of thinner and lighter electronic devices and smart devices, the circuit board 2 and the lens holder 1 will be reduced in size accordingly, so that the fixed lens barrel 61 is no longer needed between the optical lens 6 and the lens holder 1. In this case, the fixed lens barrel 61 will occupy excess space, but will affect the final molding size of the camera module.

SUMMARY

An objective of the present disclosure is to provide a camera module and an electronic device having the same, and a method for manufacturing the camera module, wherein the optical lens is directly assembled on the top of the molded base without an additional fixed lens barrel, so that compared with the existing camera module, the space occupied by the fixed lens barrel is released, so as to further reduce the size of the camera module.

Another objective of the present disclosure is to provide a camera module and an electronic device having the same, and a method for manufacturing the camera module, wherein the molded base of the camera module is integrally molded on the circuit board and the photosensitive element so that the camera module has a more compact and smaller structure.

Another objective of the present disclosure is to provide a camera module and an electronic device having the same, and a method for manufacturing the camera module, wherein the molded base of the camera module is integrally molded by a molding process and covers the electronic components attached to the circuit board, so that in the process of packaging the camera module, there is no need to reserve a safe space for the electronic components. Thus, the length and width dimensions of the circuit board are reduced, and the space utilization rate and degree of intensity of the electronic components relative to the circuit board are improved.

Another objective of the present disclosure is to provide a camera module and an electronic device having the same, and a method for manufacturing the camera module, wherein the molded base is integrally molded on the circuit board and covers the electronic components located on the circuit board so that the electronic components are isolated from each other. In this way, the interference between the electronic components in the working process is effectively avoided.

Another objective of the present disclosure is to provide a camera module, an electronic device having a camera module, and a method for manufacturing a camera module, wherein the side of the circuit board located on the edge of an electronic device is free of electronic components when the camera module is configured in the electronic device. In this way, the distance between the camera module and the edge of the electronic device is reduced, thereby reserving a sufficient space for mounting of other components of the electronic device.

Another objective of the present disclosure is to provide a camera module, an electronic device having a camera module, and a method for manufacturing a camera module, wherein the side of the circuit board located on the edge of an electronic device is free of electronic components when the camera module is configured in the electronic device. In this way, the distance between the camera module and the edge of the electronic device is reduced, and a chip of the same size can be closer to the edge of the screen.

Another objective of the present disclosure is to provide a camera module, an electronic device with a camera module, and a method for manufacturing a camera module, wherein the corresponding side of the circuit board abutting against the edge of the electronic device is free of electronic components. Based on this structure configuration, it is beneficial to the execution of the molded base panel cutting process of the panel manufacturing process of the camera module.

Another objective of the present disclosure is to provide a camera module, an electronic device with a camera module, and a method for manufacturing a camera module, wherein along the length direction of the electronic device the side of the photosensitive element adjacent to the edge of the electronic device is free of electronic components. In this way, the distance between the camera module and the electronic device in the length direction of the electronic device is reduced, thereby reserving a sufficient space for mounting of other components of the electronic device, such as a touch screen of an electronic device.

Another objective of the present disclosure is to provide a camera module, an electronic device with a camera module, and a method for manufacturing a camera module, wherein along the width direction of the electronic device the side of the photosensitive element adjacent to the edge of the electronic device is free of electronic components. In this way, the distance between the camera module and the electronic device in the width direction of the electronic device is reduced, thereby reserving a sufficient space for mounting of other components of the electronic device, such as a touch screen of an electronic device.

Another objective of the present disclosure is to provide a camera module and an electronic device having the same, and a method for manufacturing the camera module, wherein the circuit board and the photosensitive element is conductively connected by a group of lead wires, and the side of the circuit board adjacent to the electronic device is free of lead wires. In this way, the distance between the camera module and the edge of the electronic device is further reduced, thereby providing a larger assembling space for other components of the electronic device, such as a touch screen of an electronic device.

Another objective of the present disclosure is to provide a camera module and an electronic device having the same, and a method for manufacturing the camera module, wherein the side of the circuit board adjacent to the edge of the electronic device is free of lead wires, so that there is no need to worry about the lead wires being cut in the panel cutting process of the camera module. That is to say, with such a structural arrangement, the panel manufacturing process of the camera module is further optimized, which is beneficial to improving the production efficiency and reducing the manufacturing cost.

Another objective of the present disclosure is to provide a camera module and an electronic device having the same, and a method for manufacturing the camera module, wherein the molded base integrally molded on the circuit board and the photosensitive element is cut from a molded base panel prepared in an panelization process, and the side near the edge of the electronic device corresponds to one of the panel cutting sides. In this way, the distance between the side of the circuit board near the edge of the electronic device and the photosensitive element can be adjusted by adjusting the position of the cutting side on the module base panel.

Another objective of the present disclosure is to provide a camera module and an electronic device having the same, and a method for manufacturing the camera module, wherein the optical lens of the camera module is directly assembled on the top of the molded base, and the size of the optical lens is smaller than the size of the molded base to form an extension space between the optical lens and the molded base, thereby providing a larger mounting space for mounting other components of the electronic device, for example, a display screen.

Another objective of the present disclosure is to provide a camera module and an electronic device having the same, and a method for manufacturing the camera module, wherein the optical lens comprises a lens barrel unit, the lens barrel unit is provided with a stepped portion, and the stepped portion extends inwardly toward the optical axis of the optical lens, so as to further expand the extension space between the optical lens and the molded base by the stepped portion, thereby providing a wider inward extension space for mounting of other components of the electronic device.

Another objective of the present disclosure is to provide a camera module and an electronic device having the same, and a method for manufacturing the camera module, wherein the camera module comprises a filter element lens holder, the filter element lens holder and the molded base of the camera module cooperates with each other to provide support for the filter element.

Another objective of the present disclosure is to provide a camera module and an electronic device having the same, and a method for manufacturing the camera module, wherein the filter element does not need to be directly mounted on the molded base of the camera module, and the filter element lens holder has a support groove, the support groove having a smaller size than the light window of the molded base. In this way, the area required by the filter element can be effectively reduced.

Another objective of the present disclosure is to provide a camera module and an electronic device having the same, and a method for manufacturing the camera module, wherein the stress effect when the filter element is directly mounted on the molding base is relieved by the filter element lens holder to protect the filter element.

Another objective of the present disclosure is to provide a camera module and an electronic device having the same, and a method for manufacturing the camera module, wherein the filter element lens holder has a support groove, and the filter element is mounted in the support groove of the filter element, so that the position of the filter element is relatively sunk.

Another objective of the present disclosure is to provide a camera module and an electronic device having the same, and a method for manufacturing the camera module, wherein the filter element comprises a limit protrusion, and the limit protrusion restrains and limits the optical lens of the camera module to optimize the assembly process of the camera module and make the optical lens coincide with the optical axis of the photosensitive element through the limit protrusion.

In order to achieve at least one of the above objectives of the present disclosure, an aspect of the present disclosure provides a fixed-focus camera module, which is suitable for assembly in an electronic device, wherein the fixed-focus camera module comprises:

at least one circuit board;

at least one photosensitive element, which can be operatively connected to the circuit board;

at least one optical lens; and at least one molded base, wherein the molded base is integrally molded on the circuit board and the photosensitive element, and the molded base forms a light window, so as to provide a light passage for the photosensitive element, wherein the optical lens is directly assembled on the top end of the molded base without a fixed lens barrel so that the top end of the molded base does not need to provide an area for supporting the fixed lens barrel, wherein the circuit board comprises a substrate and a plurality of electronic components disposed on the substrate, and wherein the fixed-focus camera module is suitable for being assembled near an edge position of the electronic device, and the side of the circuit board adjacent to the edge of the electronic device is free of electronic components, so that a distance between the fixed-focus camera module and the top end edge of the electronic device is reduced.

According to an embodiment of the present disclosure, the circuit board further comprises a flexible board connection board and a connector, wherein the connector is connected to the flexible board connection board, and the flexible board connection board is conductively connected to the opposite side of the circuit board from the side on which the electronic components are not arranged.

According to an embodiment of the present disclosure, the circuit board has a flexible board connection side, the flexible board connection side is provided with a flexible board connection board, and the other end of the flexible board connection board is provided with a connector, wherein the flexible board connection side is disposed opposite to the side of the circuit board adjacent to the edge of the electronic device.

According to an embodiment of the present disclosure, along the length direction of the electronic device, the side of the circuit board adjacent to the edge of the electronic device is free of electronic components.

According to an embodiment of the present disclosure, along the width direction of the electronic device, the side of the circuit board adjacent to the edge of the electronic device is free of electronic component.

According to an embodiment of the present disclosure, the electronic components are arranged on at least one side of the remaining sides other than the side adjacent to the top end of the electronic device.

According to an embodiment of the present disclosure, the circuit board and the photosensitive element is conductively connected through a group of lead wires, and the side adjacent to the top end of the electronic device is free of lead wires.

According to an embodiment of the present disclosure, the circuit board and the photosensitive element is conductively connected through a group of lead wires, and the side adjacent to the top end of the electronic device is free of lead wires, wherein the lead wires are arranged on at least two side of the remaining sides other than the side adjacent to the top end of the electronic device.

According to an embodiment of the present disclosure, the camera module further comprises a filter element, wherein the filter element is disposed and held between the optical lens and the photosensitive element.

According to an embodiment of the present disclosure, the camera module further comprises a filter element, wherein the filter element is disposed and held between the optical lens and the photosensitive element, so that the filter element is aligned with the photosensitive path, so that light transmitting through the optical lens is filtered by the filter element and then reaches the photosensitive element.

According to an embodiment of the present disclosure, the top layer of the molded base has at least one groove, and the filter element is assembled in the groove.

According to an embodiment of the present disclosure, the camera module further comprises a filter element lens holder, wherein the filter element is assembled on the filter element lens holder, and the filter element lens holder is assembled on the top layer of the molded base to allow the light transmitting through the optical lens to be filtered by the filter element and then reach the photosensitive element.

According to an embodiment of the present disclosure, the optical lens is supported only by the molded base, or the optical lens is partially supported by the molded base and partially supported by the filter element lens holder.

According to an embodiment of the present disclosure, the optical lens of the camera module is directly assembled on the top of the molded base, and the size of the optical lens is smaller than the size of the top of the molded base to form an extension space between the optical lens and the molded base.

According to an embodiment of the present disclosure, the optical lens may be implemented as a one-piece lens or a split lens, which comprises at least two lens units, the lens units being assembled in cooperation with each other.

According to an embodiment of the present disclosure, the optical lens comprises a lens barrel for fixing a group of optical lens sheets therein, wherein the lens barrel is provided with a stepped portion, and the stepped portion extends inwardly toward the optical axis of the optical lens to further expand the extension space between the optical lens and the molded base by means of the stepped portion.

According to another aspect of the present disclosure, the present disclosure further provides a panel manufacturing method for a camera module, wherein the manufacturing method comprises:

correspondingly assembling at least one photosensitive element in a corresponding attaching area of a circuit board panel, respectively.

placing the circuit board panel with the photosensitive element in a molding die, and molding a molded base panel by a molding process;

cutting the molded base panel to form individual molded photosensitive assemblies; and directly assembling an optical lens on the top of the molded base to form the camera module;

According to an embodiment of the present disclosure, in the step of attaching the photosensitive element, the circuit board panel comprises a substrate provided with at least two chip attaching areas and a group of electronic components, wherein the substrate has a flexible board connection side to connect a flexible board connection board, and the electronic components are arranged on at least one side of the remaining sides other than the opposite side of the flexible board connection side of the substrate.

According to an embodiment of the present disclosure, in the step of cutting the module base panel, the corresponding cutting side of the circuit board substrate corresponds to the side near the edge of the electronic device in a subsequent process of assembling the camera module in an electronic device.

DETAILED DESCRIPTION OF THE EMBODIMENTS

Figure 1:
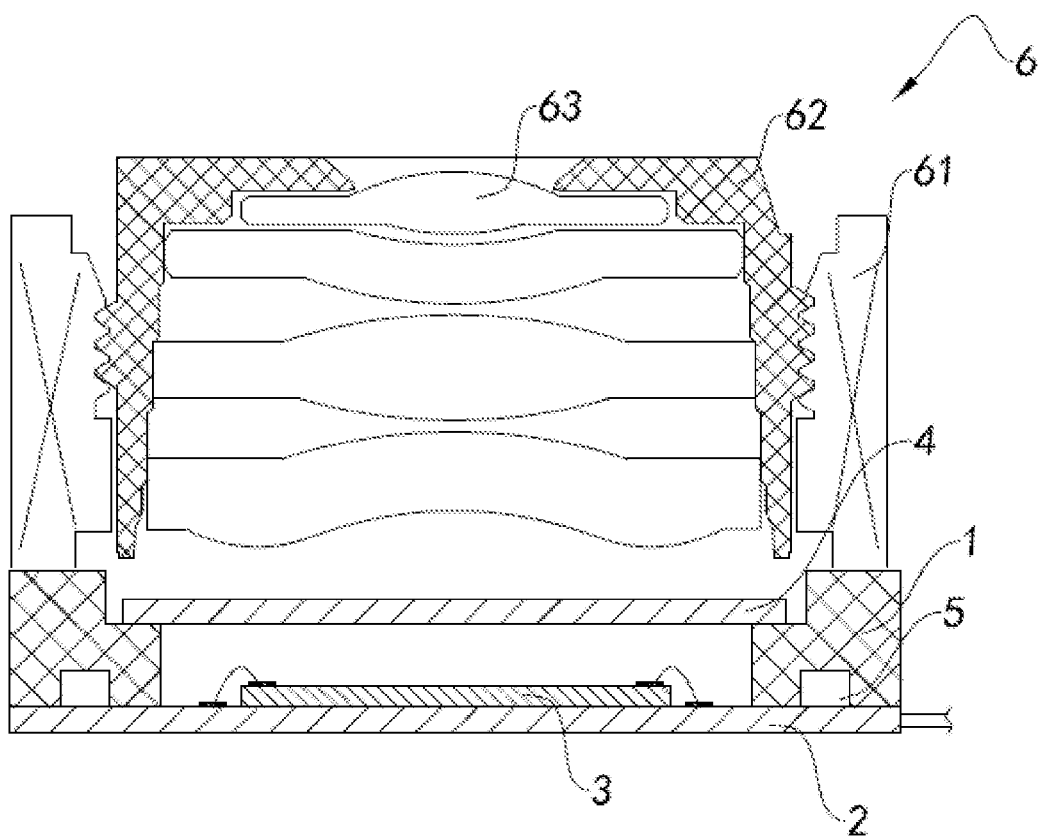
FIG. 1 is a schematic cross-sectional view of a camera module of an existing COB package.
Figure 2:
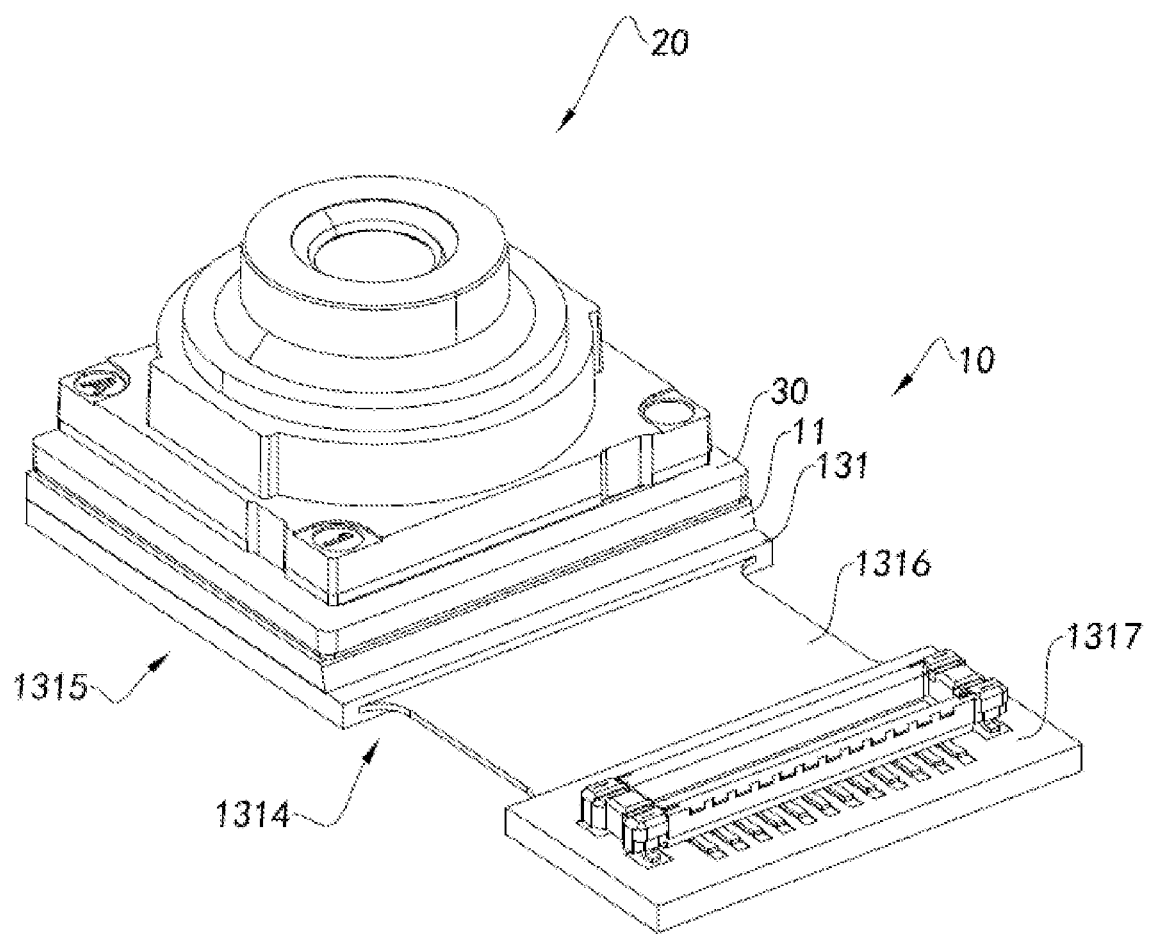
FIG. 2 is a schematic perspective view of a camera module in accordance with a first preferred embodiment of the present disclosure.

The following description is presented to disclose the present disclosure to enable those skilled in the art to practice the present disclosure. Preferred embodiments in the following description are by way of example only, and other obvious modifications are conceivable to those skilled in the art. The basic principles of the present disclosure as defined in the following description may be applied to other implementations, modifications, improvements, equivalents, and other technical solutions without departing from the spirit and scope of the present disclosure.

It should be understood by those skilled in the art that in the disclosure of the present disclosure, the orientation or positional relationship indicated by the terms "longitudinal", "transverse", "upper", "lower", "front", "back", "left", "right", "vertical", "horizontal", "top", "bottom", "inside", "outside", etc. is based on the orientation or positional relationship shown in the figures, which is merely for the convenience of describing the present disclosure and simplifying the description, and does not indicate or imply that the mentioned device or element must have a particular orientation and be constructed and operated in a particular orientation. Therefore, the above terms are not to be construed as limiting the present disclosure.

It may be understood that the term "a" should be understood to mean "at least one" or "one or more", that is, in one embodiment, the number of "a element" may be one, whereas in other embodiments, the number of the element may be multiple, and the term "a" cannot be construed as limiting the number.

As shown in FIGS. 2 to 4A, a camera module 1 in accordance with a first preferred embodiment of the present disclosure is schematically shown, wherein the camera module 1 can be applied to various electronic devices 80, such as but not limited to smart phones, wearable devices, computer devices, television sets, vehicles, cameras, monitoring apparatuses. The camera module 1 cooperates with the electronic device 80 to achieve image acquisition and reproduction of a target object.

As shown in FIGS. 2 to 4A, a camera module 1 in accordance with the first preferred embodiment of the present disclosure is shown, wherein the camera module 1 includes a molded photosensitive assembly 10 and an optical lens 20, and the optical lens 20 is assembled on the top of the molded photosensitive assembly 10 and held on the photosensitive path corresponding to the molded photosensitive assembly 10. The molded photosensitive assembly 10 includes a molded base 11, a circuit board 13, and a photosensitive element 12, wherein the photosensitive element 12 is conductively assembled in a corresponding position on the circuit board 13, and the molded base 11 is integrally packaged and molded on the circuit board 13 and the photosensitive element 12 by a molding process, so that the molded photosensitive assembly 10 has an integrated compact structure.

The molded base 11 has a light window and a base main body 111 forming the light window, the light window provides an optical passage for the photosensitive element 12, and the module base is integrally packaged to the circuit board 13 and at least a part of the non-photosensitive area of the photosensitive element 12. In particular, in the preferred embodiment of the present disclosure, the light window is a ring structure with a closed periphery, so as to provide a closed inner environment for the optical lens 20.

The circuit board 13 includes a circuit board substrate 131, and the circuit board substrate 131 is provided with a chip attaching area 1311 and a peripheral area 1312, wherein the chip attaching area 1311 is correspondingly suitable for attaching the photosensitive element 12, and the peripheral area 1312 integrally surrounds the chip mounting area 1311. The circuit board 13 further includes a group of electronic components 132, wherein the electronic components 132 are mounted on the peripheral area 1312 of the substrate, for example, being mounted by SMT process. The electronic components 132 include but are not limited to, a resistor, a capacitor, a driving device, etc. In the present embodiment of the present disclosure, the molded base 11 is integrally molded on the photosensitive element 12 and the circuit board 13, and integrally covers the electronic components 132 and at least a part of the corresponding non-photosensitive area of the photosensitive element 12 to form the molded photosensitive assembly 10. By this manufacturing method, the molded photosensitive assembly 10 has many advantages.

Firstly, since the molded base 11 is integrally molded on the photosensitive element 12 and the circuit board 13, compared with the existing camera module 1, there is no need to reserve a safe space between the molded base 11 and the photosensitive element 12 in the process of forming the molded base 11, so that the overall molding size of the molded base 11 and the molded photosensitive assembly 10 can be effectively reduced.

Secondly, since the molded base 11 is integrally molded on the photosensitive element 12 and the circuit board 13, that is, compared with the existing camera module 1, the electronic components 132 attached to the circuit board 13 can be closer to the photosensitive element 12 because there is no need to set a safe distance between the photosensitive element 12 and the electronic components 132 while performing the molding process. That is, in the circuit board 13 provided by the present disclosure, the laying density of the electronic components 132 can be relatively increased. Consequently, on the one hand, the space of the circuit board substrate 131 occupied by the same number of the electronic components 132 can be relatively reduced. On the other hand, the circuit board 13 of the same area allows a relatively larger number of the electronic components 132 to be laid, to meet the imaging hardware requirements of the camera module 1.

Further, since the molded photosensitive assembly 10 is integrally molded by a molding process, and it has a relatively more compact and smaller size structure, compared with the lens holder of the existing camera module 1, the size of the molded base 11 is relatively smaller, so that the optical lens 20 can be assembled on the molded photosensitive assembly 10 in a "bare lens" mounting manner. The content regarding this part and a specific definition of "bare lens" will be further set forth in the subsequent description.

In addition, the molded base 11 is integrally packaged on the photosensitive element 12 and the circuit board 13, and integrally covers the electronic components 132, thereby preventing that dust and debris are adhered to the electronic components 132 to contaminate the photosensitive element 12 and affect the imaging effect similarly to the conventional camera module 1. At the same time, since the molded base 11 after molding integrally covers the electronic components 132, the respective electronic components 132 can be isolated by the molded photosensitive assembly 10 to reduce the electromagnetic interference between the electronic components 132.

In addition, it is worth mentioning that since the molding material has good thermal conductivity, the heat dissipation effect of the camera module 1 can be improved by the molded base 11, and the temperature drift can be reduced to further improve the imaging quality of the camera module 1.

It can be understood that, in another modified embodiment of the present disclosure, it is also possible that the electronic device 80 is buried in the substrate, that is, the electronic components 132 may not be exposed to the outside. In this way, the molded photosensitive assembly 10 can further have a more compact and smaller structure. It is worth mentioning that, in the present preferred implementation of the present disclosure, since the molded base 11 can completely cover the electronic components 132, the electronic components 132 may not be embedded in the substrate. That is, the substrate is only used to form conductive lines, so that the molded photosensitive assembly 10 that is finally formed can have a smaller thickness and a smaller horizontal dimension (the length direction and the width direction).

Further, in some embodiments of the present disclosure, the electronic components 132 are disposed around the photosensitive element 12, whereas in different embodiments, the arrangement positions of the electronic components 132 can be designed according to needs, for example, concentrated on one side or both sides, and can be matched with the setting position of the photosensitive element 12 and the subsequent setting positions of a group of lead wires 14 conducting the photosensitive element 12 to the circuit board substrate 131, to use the space positions on the substrate more reasonably, and reduce the size of the camera module 1 as much as possible.

Preferably, in the present preferred implementation of the present disclosure, one side of the circuit board substrate 131 is free of electronic components 132. With this arrangement, the distance between the edge of the circuit board substrate 131 on this side and the photosensitive elements 12 can be effectively reduced, so that the distance between the camera module 1 and the edge of the electronic device 80 is reduced during the subsequent configuration process of mounting the camera module 1 on an electronic device 80, thereby reserving a sufficient mounting space for mounting of other components of the electronic device 80, for example, a display interface of the electronic device 80.

Figure 3:
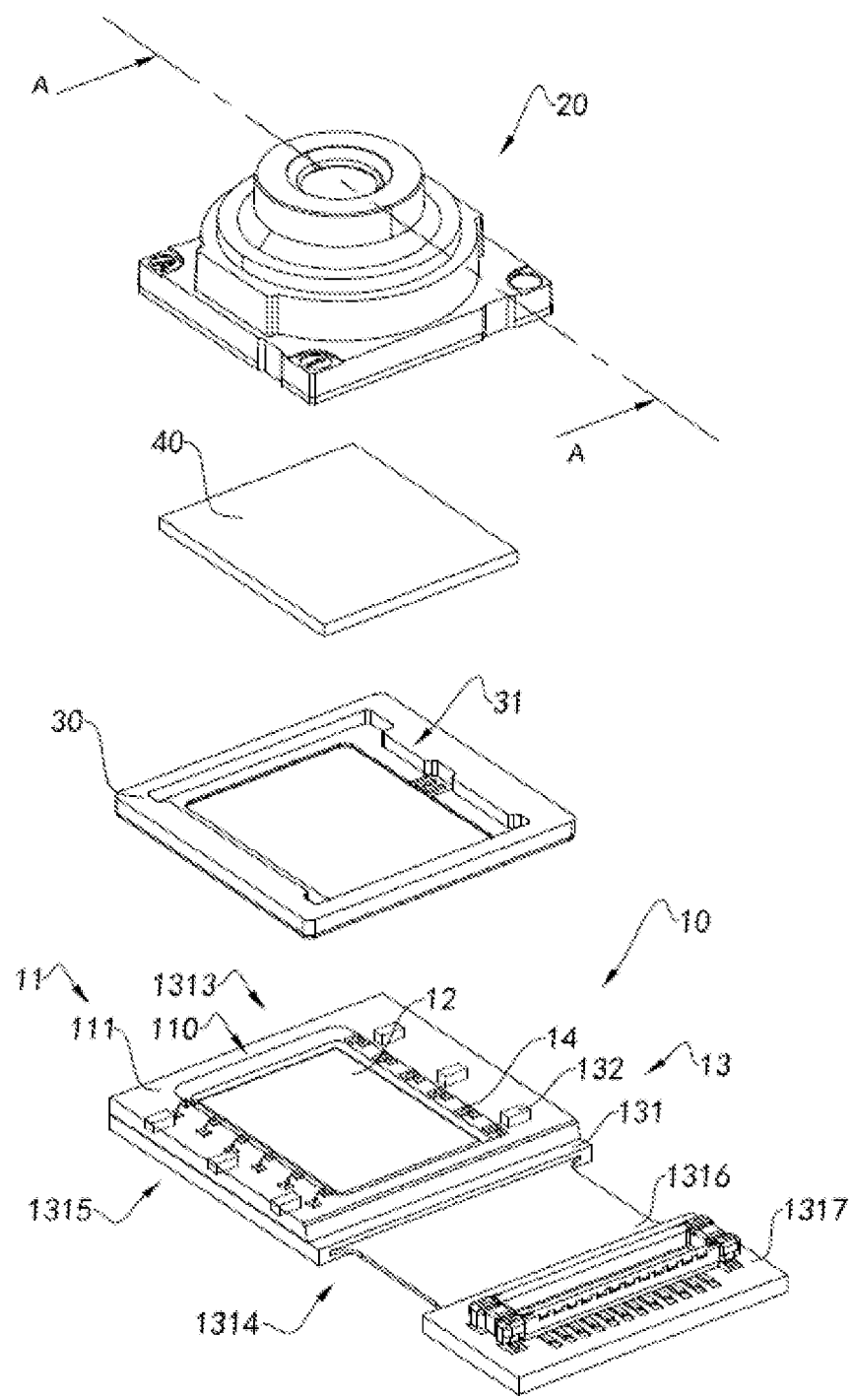
FIG. 3 is a schematic exploded view of the camera module in accordance with the above first preferred embodiment.

As shown in FIG. 3, for convenience of subsequent description, the side of the circuit board 13 not provided with the electronic components 132 is defined as a blank side 1313 of the circuit board 13. Further, in the preferred embodiment of the present disclosure, the electronic components 132 are disposed on at least one of the remaining sides other than the blank side 1313 of the circuit board substrate 131. For example, in some embodiments of the present disclosure, the electronic components 132 may be disposed on three sides or two sides other than the blank side 1313, or concentratedly arranged on any side of the circuit board 13 other than the blank side 1313. In this way, any electronic component 132 is not arranged on the blank side 1313 to achieve the design purpose. It should be understood by those skilled in the art that the arrangement of the electronic components 132 on the remaining sides of the circuit board substrate 131 is not a limitation of the present disclosure, as long as the electronic components 132 are not mounted on at least one side of the circuit board 13.

Preferably, in the preferred embodiment of the present disclosure, the electronic components 132 are disposed on two wing sides 1315 of the circuit board substrate 131, and the blank side 1313 extends between the two wing sides 1315. In this way, the electronic components 132 on the circuit board substrate 131 have a relatively symmetrical and regular structural arrangement, which is beneficial to the execution of the manufacture and production processes of the molded photosensitive assembly 10. The content regarding this part will be described in more detail in the panel manufacturing process of the molded photosensitive assembly 10 mentioned later.

Further, in the present disclosure, the circuit board substrate 131 may be a rigid board of a PC filter element lens holder 30, a flexible board of the PC filter element lens holder 30, a Rigid-Flex board, a ceramic substrate, and the like. In the preferred embodiment of the present disclosure, the substrate is a Rigid-Flex board. That is, in the preferred embodiment of the present disclosure, the circuit board substrate 131 has a flexible board connection side 1314 for connecting a flexible board connection board 1316, wherein the other end of the flexible board connection board 1316 is provided with a connector 1317 to connect the camera module 1 and the electronic device 80 through the connector 1317. Preferably, in the preferred embodiment of the present disclosure, the flexible board connection side 1314 is disposed opposite to the blank side 1313 of the circuit board substrate 131. Of course, those skilled in the art should know that the flexible board connection side 1314 can also be disposed on adjacent sides (two wing sides 1315) that intersects with the blank side 1313. That is, in the present disclosure, the arrangement position of the flexible board connection board 1316 can be freely selected according to the actually required fitting position requirements, as long as the flexible board connection side 1314 is not disposed on the blank side 1313.

It is worth mentioning that, in the present disclosure, the flexible board connecting board 1316 may be implemented as an abnormal structure. That is, the flexible board connecting board 1316 has an irregular shape, so that with the abnormal structure of the flexible board connecting board 1316, the connector 1317 connected to the flexible board connection board 1316 extends to a position of the connection port of the electronic device 80. In this way, the flexible board connection side 1314 of the circuit board substrate 131 can be caused to have a relatively free setting position.

Further, the photosensitive element 12 is correspondingly mounted on the chip attaching area 1311 of the circuit board substrate 131, such as, but not limited to, a SMT process (Surf circuit board substrate 131ce Mount Technology, surface mount process), or is electrically connected to the substrate by means of a CO filter element lens holder 30 (Chip On filter element lens holder 30o circuit board substrate 131rd). Of course, in other embodiments of the present disclosure, the manner in which the photosensitive element 12 is mounted on the substrate can also be achieved by other manners, such as in-line and FC (flip chip). It should be understood by those skilled in the art that the connection manner and the conduction manner of the photosensitive element 12 and the circuit board 13 are not a limitation of the present disclosure.

In the preferred embodiment of the present disclosure, the photosensitive element 12 is electrically connected to the substrate through a group of lead wires 14, wherein the lead wires 14 extend between corresponding connection ends of the circuit board substrate 131 and the photosensitive element 12, and after the molded base 11 is molded, the lead wires 14 are embedded by the molded base 11 so that the connection between the lead wires 14 and the photosensitive element 12 and the circuit board substrate 131 is more stable. It is worth mentioning that the lead wires 14 include but are not limited to gold wires, silver wires, copper wires, aluminum wires or alloy wires (copper-aluminum alloy wires), and the like.

Preferably, the blank side 1313 of the circuit board substrate 131 is free of lead wires 14, so that the distance between the edge of the blank side 1313 and the photosensitive element 12 can be further reduced. Consequently, during the subsequent process of mounting the camera module 1 in an electronic device 80, the blank side 1313 of the circuit board substrate 131 is disposed adjacent to the edge of the electronic device 80, so that the camera module 1 as a whole is closer to the edge of the electronic device 80. In this way, a wider space is reserved for mounting of other components of the electronic device 80. For example, in some embodiments of the present disclosure, the camera module 1 is assembled in a smart phone as a front camera of the smart phone, and by the arrangement of the blank side 1313 of the circuit board and the lead wires 14, a wider mounting space is provided for a display screen of the smart phone, so that the display screen of the smart phone can be expanded without changing the surface size of the smart phone, improving the "screen ratio".

More specifically, in the present disclosure, the lead wires 14 are arranged on the remaining sides other than the blank side 1313 of the circuit board substrate 131. That is, in the present disclosure, the lead wires 14 may be concentratedly disposed on any side other than the blank side 1313 of the circuit board substrate 131, or is arranged on two sides other than the blank side 1313 of the circuit board substrate 131, or is arranged on all the remaining sides other than the blank side 1313 of the circuit board substrate 131. Preferably, in the preferred embodiment of the present disclosure, the lead wires 14 are disposed on two wing sides 1315 of the circuit board substrate 131, so that the circuit board 13 has a more regular and symmetrical structure to facilitate the execution of the panel manufacturing process of the molded photosensitive assembly 10. Similarly, the content regarding this part will be described in more detail in the manufacturing process of the molded photosensitive assembly 10 mentioned later.

It is worth mentioning that, in the preferred embodiment of the present disclosure, the circuit board substrate 131 has a flat board shape, and the photosensitive element 12 is attached to the top surface of the circuit board substrate 131. In another embodiment, the circuit board substrate 131 may have an inner groove 112, and the photosensitive element 12 is received in the inner groove 112 to reduce the height of the photosensitive element 12 protruded from the circuit board substrate 131. In another embodiment, the circuit board substrate 131 may have a through hole communicating with both sides of the circuit board substrate 131, and the photosensitive element 12 is received in the through hole so that the relative position of the photosensitive element 12 and the circuit board substrate 131 is adjustable. In another embodiment, the circuit board substrate 131 may have a passage, the passage has a stepped structure, and the photosensitive element 12 is mounted on the passage in a flip-chip manner. In another embodiment, the circuit board substrate 131 may have a reinforcing hole, and the integrated base extends into the reinforcing hole to enhance the structural strength of the integrated base assembly. In another embodiment, the circuit board substrate 131 includes a back plate, and the back plate is stacked on the bottom of the circuit board substrate 131 to enhance the structural strength and heat dissipation performance of the molded photosensitive assembly 10. The back plate is exemplified by but not limited to a metal plate. In another embodiment, the molded photosensitive assembly 10 includes an electromagnetic shielding layer, and the electromagnetic shielding layer is wrapped on the outside of the integrated base or surrounds the inside to enhance the anti-electromagnetic interference ability of the camera module 1. In other embodiments of the present disclosure, the circuit board 13 may also have various other modifications to increase or enhance different performances of the integrated base assembly. It should be understood by those skilled in the art hat the structural modification of the circuit board 13 described above is not a limitation of the present disclosure.

As described previously, the molded base 11 is integrally molded on the circuit board 13 and the photosensitive element 12, so that compared with the lens holder of the existing camera module 1, the molded base 11 has a relatively smaller size, especially in the length and width directions. Consequently, the optical lens 20 provided by the present disclosure can be directly mounted on the top of the molded base 11 without an additional fixed lens barrel. That is, in the present disclosure, compared with the optical lens 20 of the existing camera module 1, the space occupied by the fixed lens barrel is effectively released. On the one hand, the size of the optical lens 20 can be further reduced. On the other hand, the released space provides a mounting space for other components of the electronic device 80.

More specifically, in the preferred embodiment of the present disclosure, the optical lens 20 includes a lens barrel unit 21 and a group of optical lens sheets 22. Based on the optical system design of the optical lens 20, the optical lens sheets 22 are assembled to the lens barrel unit 21 in a certain order to form the optical lens 20. Further, in the camera module 1 provided by the present disclosure, the optical lens 20 can be directly assembled on the top of the molded base 11 without providing an additional fixed lens barrel. That is, in the preferred embodiment of the present disclosure, the lens barrel unit 21 of the optical lens 20 may completely be disposed across the light window corresponding to the molded base 11, so that the optical lens 20 is supported on the top of the molded base 11 by the lens barrel unit 21.

Figure 4A:
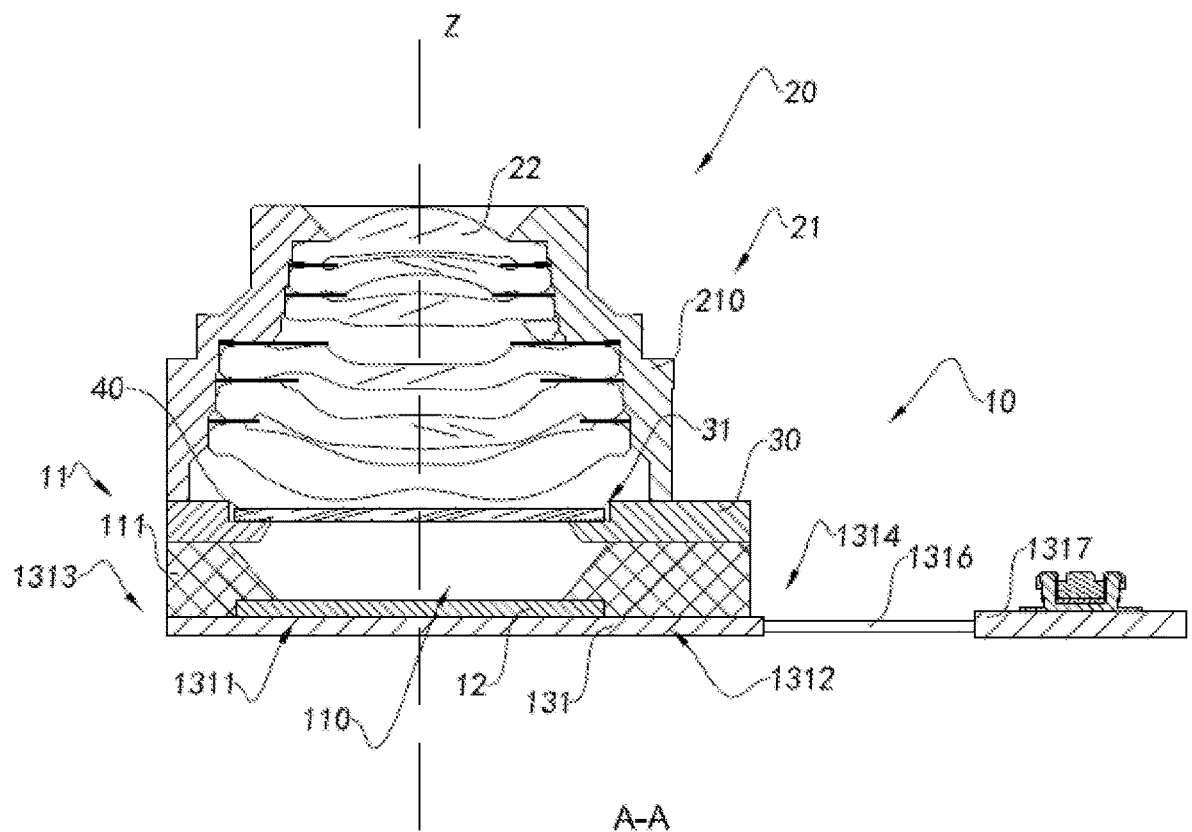
FIG. 4A is a schematic cross-sectional view along an A-A direction of the camera module in accordance with the above first preferred embodiment.

Further, as shown in FIG. 4A, the optical lens 20 of the camera module 1 is directly assembled on the top of the molded base 11, and the size of the optical lens 20 is smaller than that of the top of the molded base 11 to form an extension space 23 between the optical lens 20 and the molded base 11. In the process of assembling the camera module 1 to an electronic device 80, the extension space 23 provides an additional mounting space for the mounting of other components of the electronic device 80. For example, the camera module 1 is assembled in a smart phone as a front camera of the smart phone, and a display screen of the smart phone can be further extended into the extension space 23, so that the purpose of expanding the display screen of the smart phone and improving the "screen ratio" may be further achieved without changing the surface size of the smart phone.

Further, the lens barrel unit 21 further has a stepped portion, and the stepped portion extends inwardly along the optical axis direction defined by the optical lens 20 to further expand the extension space 23 by the stepped portion. That is, in the process of assembling the camera module 1 to the smart phone, the display screen of the smart phone can be further extended to the shoulder of the stepped portion of the lens barrel unit 21. In this way, the purpose of expanding the display screen of the smart phone and improving the "screen ratio" may be further achieved.

It is worth mentioning that, in the preferred embodiment of the present disclosure, the optical lens 20 may be an integrated optical lens 20 or be implemented as a split optical lens 20, wherein when the optical lens 20 is implemented as a split optical lens 20, the optical lens 20 includes at least two lens units, and the lens units in cooperation with each other are assembled to form the optical lens 20.

Further, in the camera module 1 provided by the preferred embodiment of the present disclosure, the camera module 1 further includes a filter element 40, and the filter element 40 is disposed between the optical lens 20 and the molded photosensitive assembly 10 to filter the light passing through the optical lens 20 by the filter element 40. More specifically, the filter element 40 is disposed on the molded base 11 and is located in the light propagation path formed by the photosensitive element 12 and the optical lens 20, so that light in the wavebands affecting the imaging quality, such as light waves in the infrared band, can be filtered by the filter element 40. The filter element 40 is exemplified by but not limited to, an infrared filter, a blue glass filter, a wafer-level infrared cut-off filter, a whole transparent sheet, and a visible light filter.

Figure 4B:
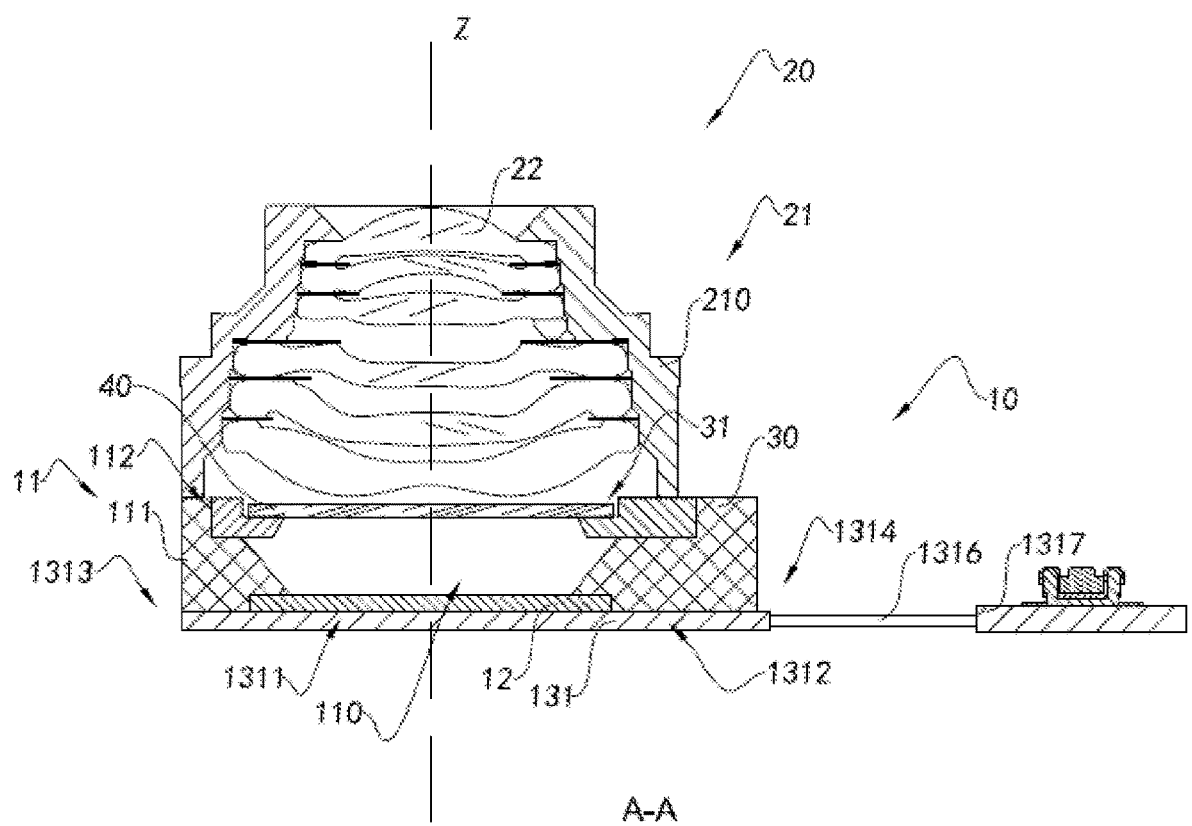
FIG. 4B is a schematic cross-sectional view along an A-A direction of a modified embodiment of the camera module in accordance with the above first preferred embodiment.
Figure 4C:
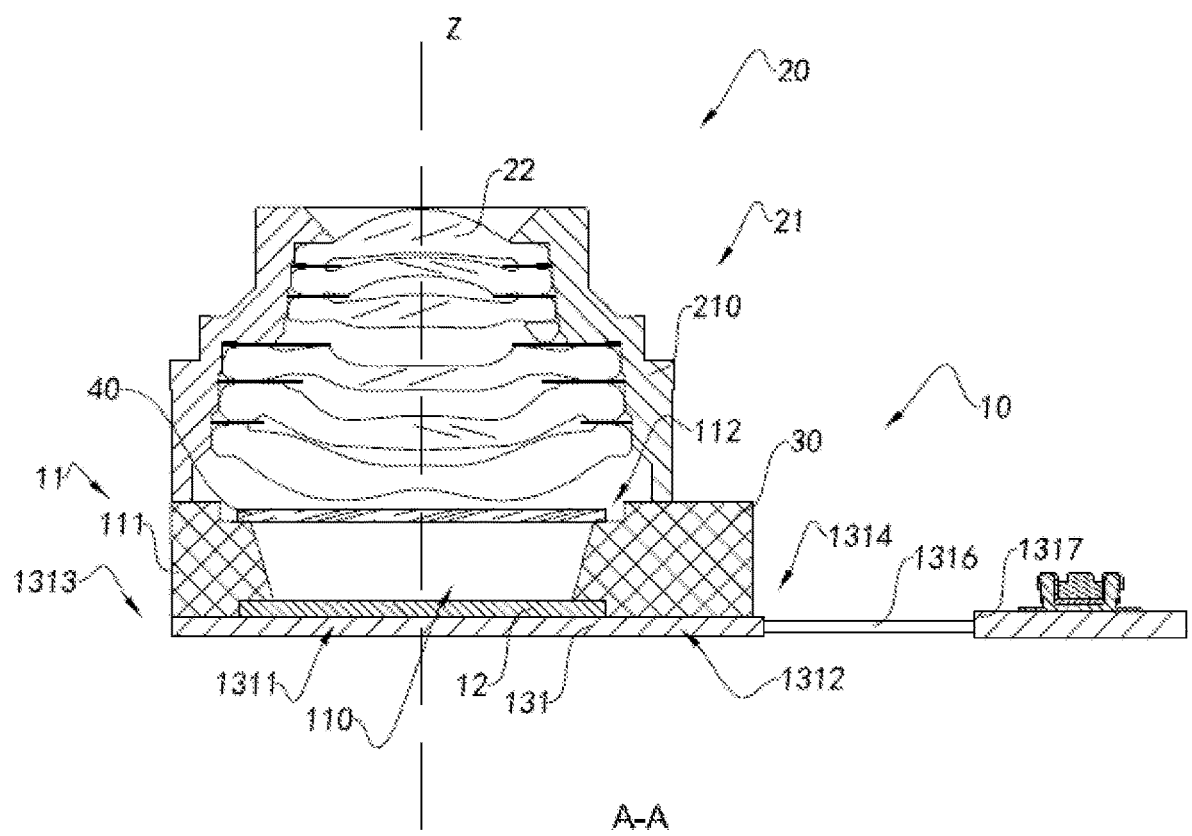
FIG. 4C is a schematic cross-sectional view along an A-A direction of another modified embodiment of the camera module in accordance with the above first preferred embodiment.

As shown in FIG. 4C, in some embodiments of the present disclosure, a groove 112 is provided on the top of the molded base 11, and the filter element 40 is received in the groove 112. In this way, the distance between the filter element 40 and the photosensitive element 12 can be reduced, so that the optical function of the filter element 40 is brought into full play.

It is worth mentioning that the filter element 40, such as a blue glass filter, is a relatively fragile and relatively expensive element, and it is easy to break. Therefore, the filter element 40 is protected during the manufacturing process of the camera module, which is also an extremely important aspect. Correspondingly, in the preferred embodiment of the present disclosure, the camera module 1 further includes a filter element lens holder 30, the filter element 40 is mounted on the filter element lens holder 30, and the filter element lens holder 30 is assembled on the top of the molded base 11 to provide a suitable mounting position for the filter element 40 by the filter element lens holder 30, achieving the purpose of protecting the filter element 40.

It is worth mentioning that, in the preferred embodiment of the present disclosure, the molded base 11 is made by using a molding process, such as an injection molding or compression molding process, and the material of the filter element lens holder 30 is not limited as long as it has sufficient strength to mount the filter element 40. Preferably, the filter element lens holder 30 and the molded base 11 can be manufactured by using different manufacturing processes. For example, the filter element lens holder 30 is manufactured by an injection molding process, and the molded base 11 is manufactured by using transfer compression molding. Therefore, different materials can be used so that the filter element lens base 30 and the molded base 11 have different hardnesses and different surface flexibility. For example, the filter element lens base 30 may be caused to have better flexibility, so that when the filter element 40 is mounted on the filter element lens holder 30, the stress received when it is mounted to the optical element lens base 30 is smaller relative to the case where it is mounted on the molded base 11. Thus, it is more suitable for mounting the filter element 40, so that the filter element 40 is not damaged or broken. In other words, the filter element lens holder 30 relieves the external stress that the filter element 40 may receive, such as the stress received when it is directly adhered to the molded base 11.

In the preferred embodiment of the present disclosure, the top surface of the molded base 11 extends flatly. In other words, the molded base 11 forms a platform structure without stepped protrusions, and the filter element lens holder 30 is mounted on the platform structure. It is worth mentioning that in this way, the top surface of the molded base 11 extends flatly without any obvious bending angle. Therefore, during the molding process, a flatter and burr-free mounting surface can be obtained, providing a flat mounting condition for mounting of the filter element lens holder 30 and the optical lens 20.

In the preferred embodiment of the present disclosure, the filter element lens holder 30 has a size corresponding to the top surface of the molded base 11 and is superimposedly attached on the top surface of the molded base 11 to support the filter element 40. In this case, the subsequently mounted optical lens 20 is supported by the filter element lens holder 30 instead of the molded base 11.

Further, the filter element lens holder 30 has a support groove 31, wherein the support groove 31 is concavely formed in the middle area of the filter element lens holder 30, and the support groove 31 correspondingly communicates with the light window and is used to mount the filter element 40. It is worth mentioning that when the filter element 40 is received in the support groove 31, the relative height between the filter element lens holder 30 and the filter element 40 is reduced, so that the filter element 40 does not or less protrude from the filter element lens holder 30. Thus, the height dimension of the finally formed camera module 1 is reduced.

As shown in FIG. 4B, a schematic view of another mounting manner of the filter element lens holder 30 is shown, wherein the top of the molded base 11 is provided with a receiving groove, and the receiving groove is concavely formed on the top of the molded base 11 and has a size matched with the filter element lens holder 30, so that the filter element lens holder 30 can be coincidently received therein. In this way, the overall height of the molded photosensitive assembly 10 can be further reduced. That is, preferably, the filter element lens holder 30 has a height dimension corresponding to the receiving groove, so that when the filter element lens holder 30 is mounted in the receiving groove, the top surface of the molded base 11 coincides with the top surface of the filter element 40. Thus, the molded base 11 and the filter element lens base 30 both provide supporting surfaces for the subsequent mounting of the optical lens 20. That is, the subsequently mounted optical lens 20 may be supported only by the molded base 11, or the optical lens 20 may be partially supported by the molded base 11 and partially supported by the filter element lens holder 30, or may be supported only by the filter element lens holder 30, so that the size and mounting position of the optical lens 20 can have more options.

Figure 4D:
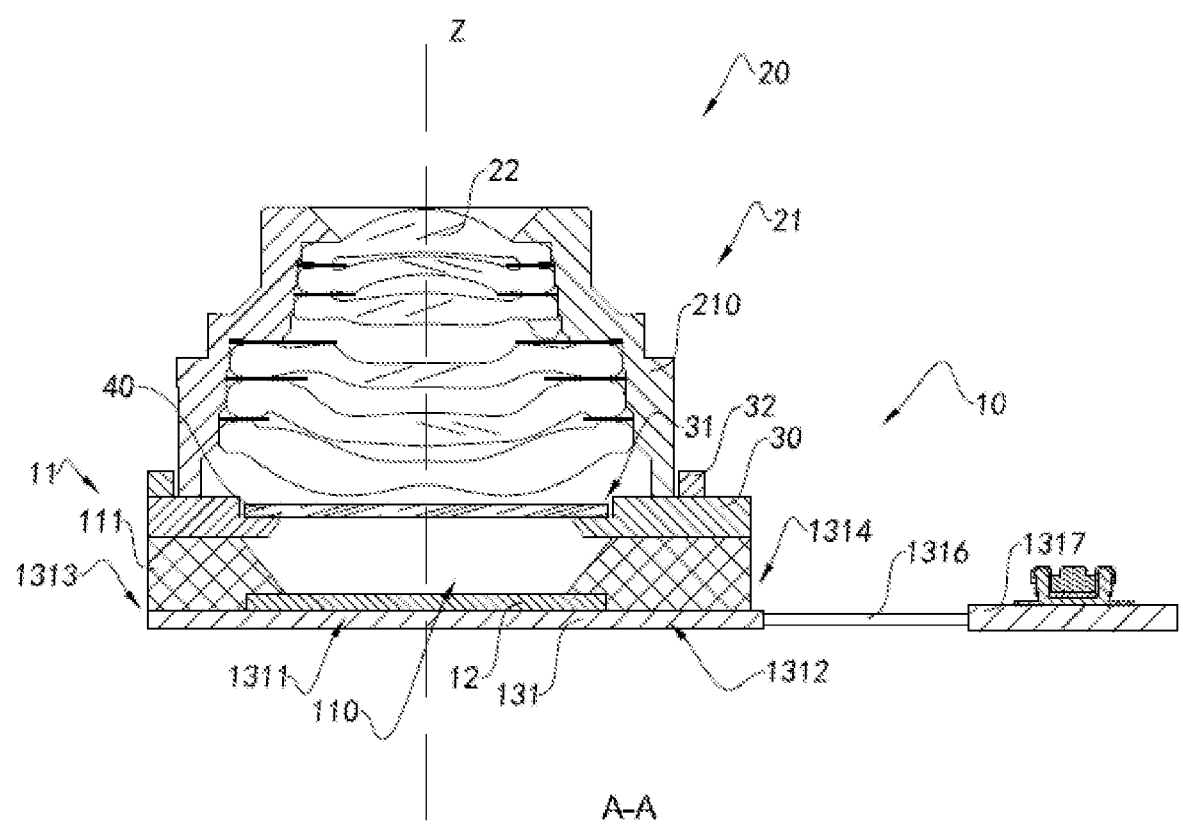
FIG. 4D is a schematic cross-sectional view along an A-A direction of further another modified embodiment of the camera module in accordance with the above first preferred embodiment.

As shown in FIG. 4D, in some embodiments of the present disclosure, the filter element lens holder 30 is further provided with a limit protrusion 32, and the limit protrusion 32 at least partially convexly extends upwardly from the top surface of the filter element lens holder 30, so as to limit and guide the mounting of the optical lens 20, and to block dust or light from entering into the interior of the camera module 1 after the assembly is completed. In particular, in the present disclosure, the arrangement position of the limit protrusion in relation to the filter element 40 can be designed according to the size of the optical lens 20, so that when the optical lens 20 is attached to the top of the molded base 11, the limit protrusion 32 can assist in alignment to facilitate the execution of the mounting operation, and prevent glue required by mounting the optical lens 20 from overflowing to the inside to contaminate the lens or the internal elements during the process of attaching the optical lens 20 with the glue.

In particular, the limit protrusion 32 may be an annular protrusion, so as to position the optical lens 20 as a whole. It is worth mentioning that, in other embodiments of the present disclosure, the surface of the limit protrusion 32 may be provided with screw threads, so as to directly mount the optical lens 20, and when screw threads are provided on the outside of the limit protrusion 32, it is suitable for the optical lens 20 with a larger aperture.

It should be easily conceivable to those skilled in the art that, in another embodiment of the present disclosure, the limit protrusion 32 may also be formed at a corresponding position of the molded base 11 to limit and guide the mounting of the optical lens 20, wherein the limit protrusion 32 may be integrally molded on the top of the molded base 11, for example, by a secondary molding process, or the limit protrusion 32 is a separate component and is assembled at a corresponding position of the molded base 11, for example, by means of gluing.

As shown in FIGS. 5A to 7, it is a schematic view of manufacture for a molded photosensitive assembly panel of the camera module 1, wherein the molded photosensitive assembly 10 is manufactured in batches, so that the manufacture efficiency of the molded photosensitive assembly 10 and the camera module 1 is greatly improved.

Figure 5A:
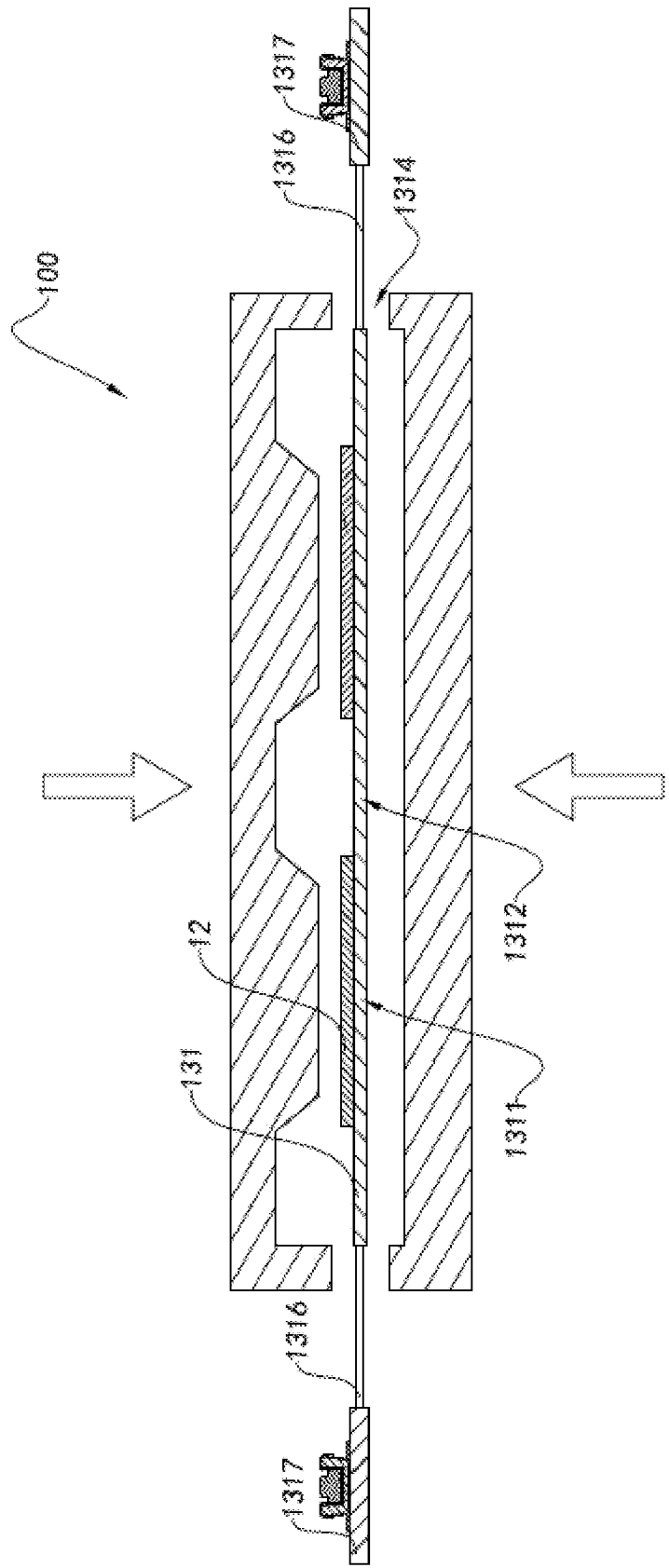
FIG. 5A is a schematic molding-and-clamping view of a schematic panel manufacturing view of a camera module shown according to a preferred embodiment of the present disclosure.

As shown in FIG. 5A, a circuit board panel 200 is provided, wherein the circuit board panel 200 includes a circuit board substrate 131, the circuit board substrate 131 is provided with at least two chip attaching areas 1311, and the chip attaching areas 1311 are each attached with a photosensitive element 12. In the preferred embodiment of the present disclosure, the circuit board panel 200 is integrally formed by two columns of individual circuit boards 13, and a group of flexible board connection boards 1316 are provided on both sides of the circuit board panel 200, respectively.

It is worth mentioning that the circuit board panel 200 also includes a series of electronic components 132, wherein one side of the circuit board substrate 131 is free of electronic components 132. For convenience of description, the side of the circuit board 13 not provided with the electronic components 132 is defined as a blank side 1313 of the circuit board 13. In the preferred embodiment of the present disclosure, the blank side 1313 of the circuit board 13 is correspondingly disposed on the middle intersection side of the two columns of individual circuit boards 13, and the electronic components 132 are disposed on at least one of the remaining sides other than the blank side 1313 of the circuit board substrate 131. Preferably, in the preferred embodiment of the present disclosure, the electronic components 132 are disposed on both wing sides 1315 of the circuit board substrate 131, and the blank side 1313 extends between the two wing sides 1315, so that the electronic components 132 on the circuit board substrate 131 have a relatively symmetrical and regular structural arrangement, which is beneficial to the execution of the manufacture and production processes of the molded photosensitive assembly 10.

Further, the photosensitive element 12 is electrically connected to the circuit board substrate 131 by a group of lead wires 14, wherein the lead wires 14 are arranged on the remaining sides other than the blank side 1313 of the circuit board substrate 131. That is, in the present disclosure, the lead wires 14 may be concentratedly disposed on any side other than the blank side 1313 of the circuit board substrate 131 or may be arranged on two sides other than the blank side 1313 of the circuit board substrate 131 or arranged on all the remaining sides other than the blank side 1313 of the circuit board substrate 131. Preferably, in the preferred embodiment of the present disclosure, the lead wires 14 are also disposed on both wing sides 1315 of the circuit board substrate 131.

Figure 5B:
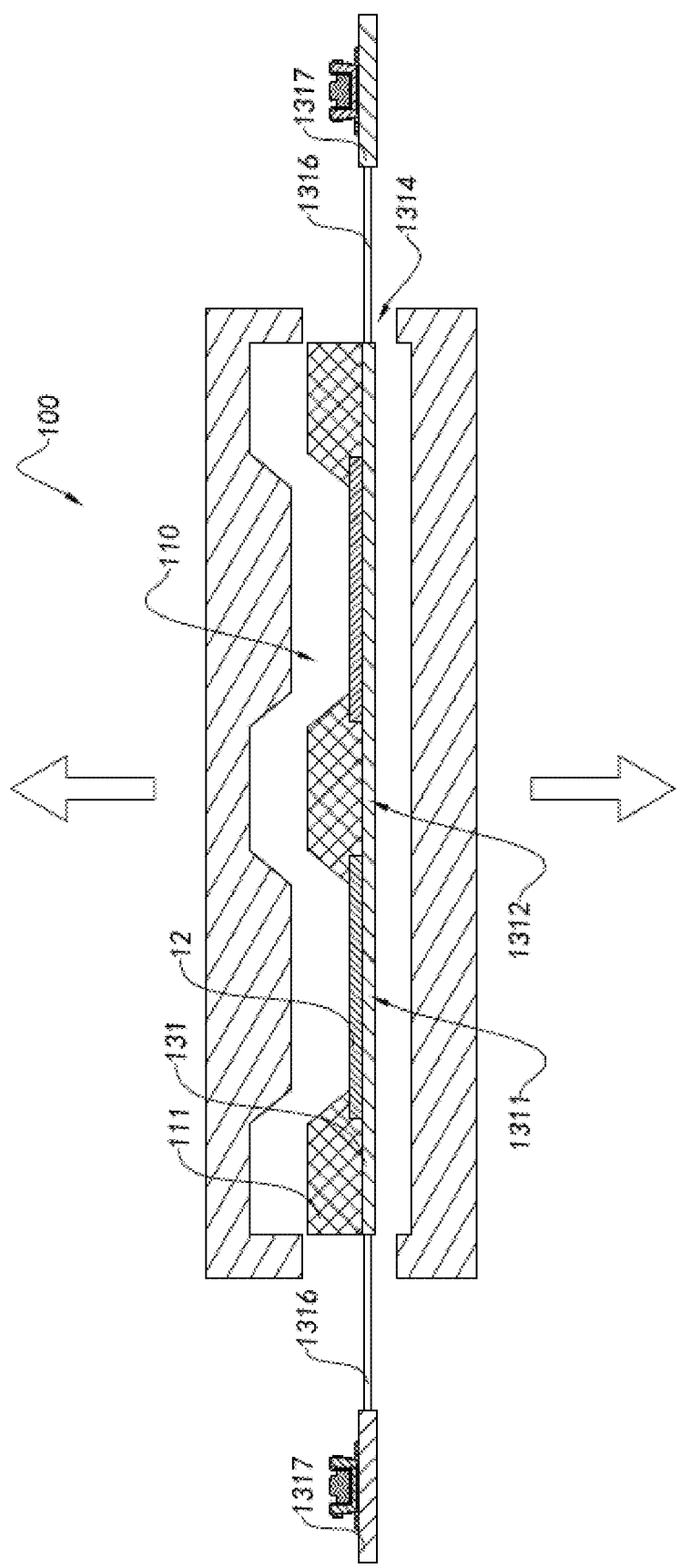
FIG. 5B is a schematic molding-and-drafting view of the schematic panel manufacturing view of the camera module shown according to the preferred embodiment of the present disclosure.

As shown in FIG. 5B, after the photosensitive element 12 is separately and correspondingly conductively assembled to the circuit board panel 200, the circuit board panel 200 with the photosensitive elements 12 is placed in a molding cavity of a molding die 100, and a molded base panel 300 is formed on the photosensitive element 12 and the circuit board substrate 131 after molding, wherein an panel of the molded base 11 integrally covers at least a part of the photosensitive element 12 and the electronic components 132 formed on the circuit board panel 200.

Figure 6:
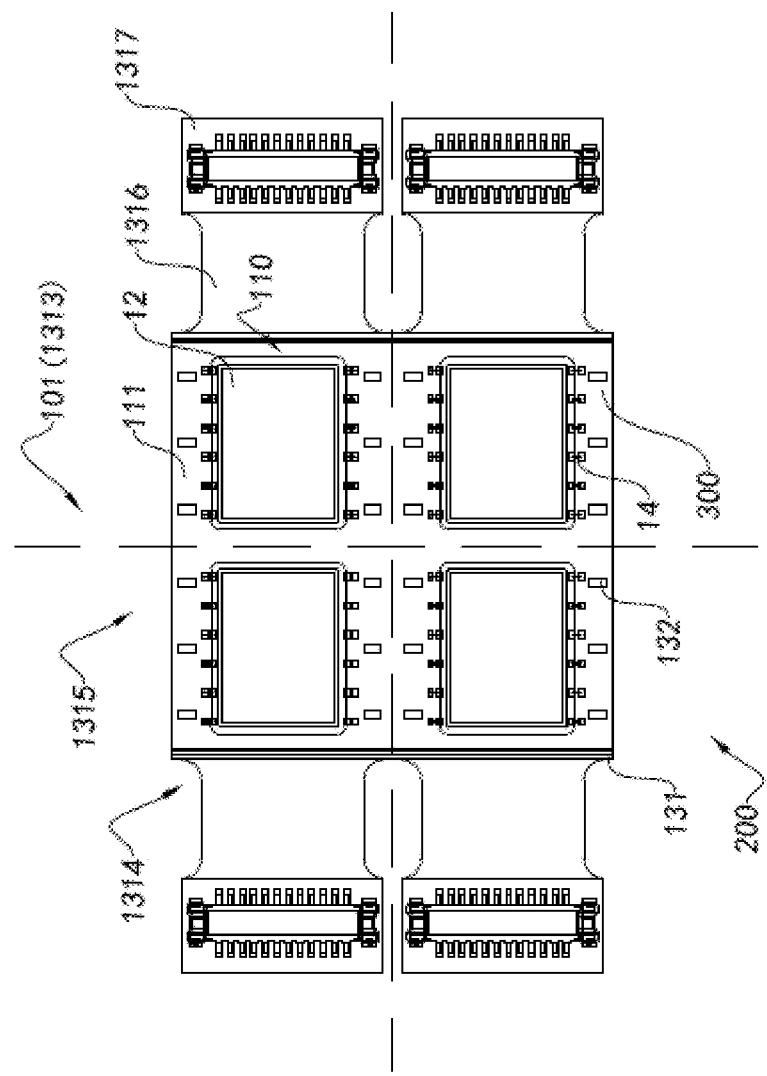
FIG. 6 is a schematic view of cutting the molded photosensitive assembly of the schematic panel manufacturing view of the camera module shown according to the preferred embodiment of the present disclosure.
Figure 7:
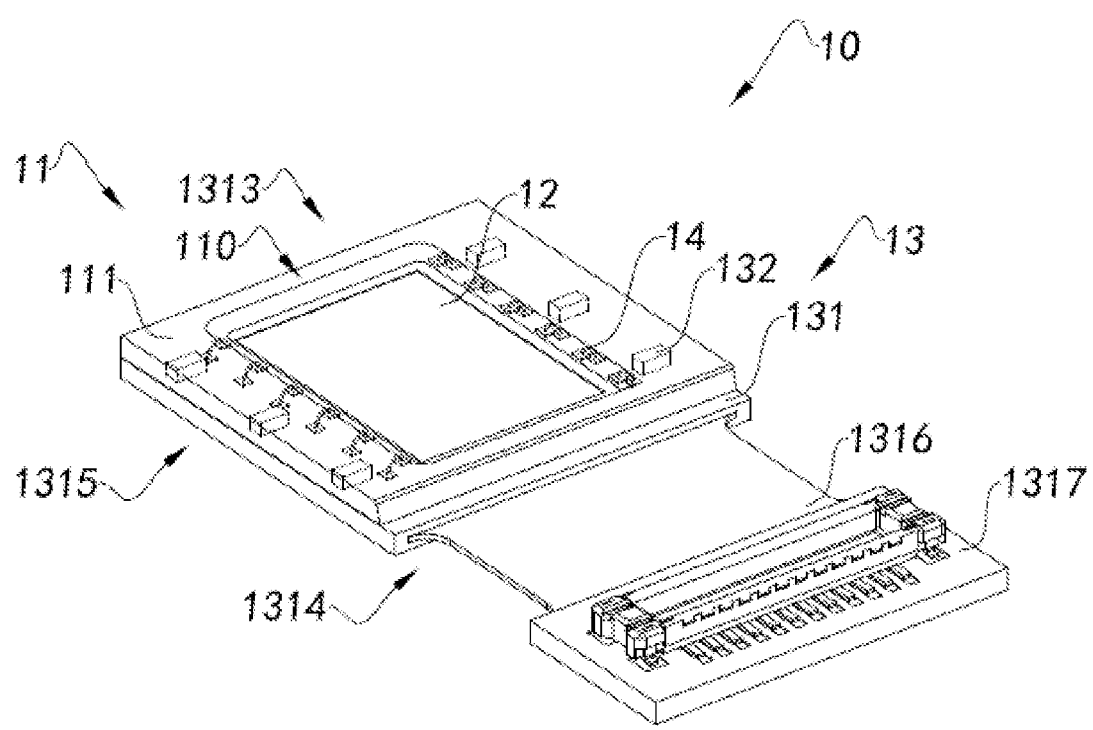
FIG. 7 is a schematic view of obtaining individual molded photosensitive assemblies of the schematic panel manufacturing view of the camera module shown according to the preferred embodiment of the present disclosure.

As shown in FIG. 6, the molded base panel 300 is further cut to form a plurality of individual molded photosensitive assemblies 10 at a time. It is worth mentioning that in the present disclosure, the blank side 1313 of the circuit board substrate 131 is not provided with the electronic components 132 and the lead wires 14. Thus, in the process of cutting the molded base panel 300, on the one hand, there is no need to worry about cutting the electronic components 132 and the lead wires 14 by mistake; and on the other hand, in this way, a gap between the edge of the blank side 1313 and the photosensitive element 12 can be reduced as much as possible, so that in the subsequent process of assembling in an electronic device 80, the module is closer to the edge of the electronic device 80, so as to provide a larger mounting space for other components of the electronic device 80. That is, in the subsequent process of assembling the camera module 1 in an electronic device 80, the cutting side 101 corresponds to the side of the camera module 1 adjacent to the edge of the electronic device 80. In this way, the distance between the camera module 1 and the edge of the electronic device 80 is reduced, and a larger mounting space is provided for other components of the electronic device 80, such as a display screen.

Further, the filter element 40 is assembled on the filter element lens holder 30, and the filter element lens holder 30 is assembled at a corresponding position on the top of the molded base 11. It is worth mentioning that in the manufacturing process for the camera module 1 of the present disclosure, the mounting order between the filter element 40 and the filter element 40 can be adjusted. For example, in some embodiments of the present disclosure, the filter element 40 may be assembled on the filter element lens holder 30, and then the filter element lens holder 30 is correspondingly assembled at a corresponding position on the top of the molded base 11. Alternatively, in other implementations of the present disclosure, the filter element lens holder 30 may be firstly mounted at a corresponding position on the top of the molded base 11, and then the filter element 40 may be correspondingly attached to a support groove 31 formed by the filter element lens holder 30. That is, in the manufacturing method for the camera module 1 provided by the present disclosure, the mounting order between the filter element lens holder 30 and the filter element 40 is not a limitation of the present disclosure. It is worth mentioning that, in other embodiments of the present disclosure, the filter element 40 may also be directly assembled in a corresponding mounting groove on the top of the molded base 11. That is, in other embodiments of the present disclosure, the filter element lens holder 30 may not be required.

Further, the optical lens 20 is assembled on the top of the molded base and held in the photosensitive path of the molded photosensitive assembly 10. More specifically, in the panel manufacturing process for a camera module provided by the present disclosure, the optical lens 20 is directly assembled on the top of the molded base 11 without an additional fixed lens barrel. It is worth mentioning that the size of the optical lens 20 is smaller than the size of the top of the molded base 11, so that an extension space 23 is formed between the optical lens 20 and the molded base 11. Thus, in the process of assembling the camera module 1 in an electronic device 80, the extension space 23 provides an additional mounting space for mounting of other components of the electronic device 80. For example, the camera module 1 is assembled in a smart phone as a front camera of the smart phone, and a display screen of the smart phone can be further extended into the extension space 23, so that the purpose of expanding the display screen of the smart phone and improving the "screen ratio" may be further achieved without changing the surface size of the smart phone.

It is worth mentioning that, in the preferred embodiment of the present disclosure, the optical lens 20 may be an integrated optical lens 20 or be implemented as a split optical lens 20, wherein when the optical lens 20 is implemented as a split optical lens 20, the optical lens 20 includes at least two lens units, and the lens units cooperate with each other and are assembled to form the optical lens 20. That is, when the optical lens 20 is implemented as a split optical lens 20, the manufacturing process of the present disclosure may further include a process of assembling the lens units of the split optical lens 20 in cooperation with each other.

Figure 8:
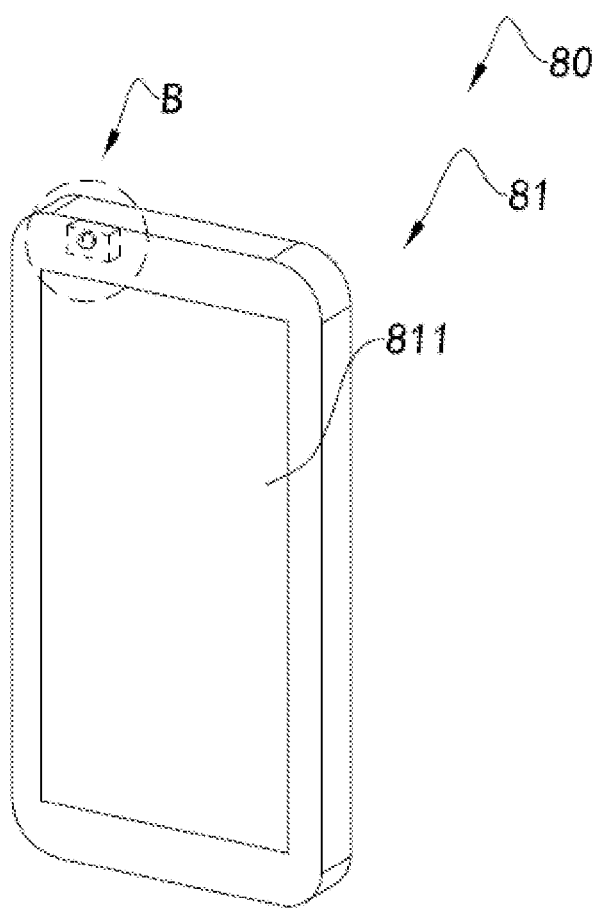
FIG. 8 is a schematic perspective view of an electronic device configured with a camera module provided by the present disclosure.

According to the above-mentioned manufacturing method for the camera module 1, the present disclosure also provides a manufacturing method for a fixed-focus camera module 1, wherein the method comprises steps of:

correspondingly assembling at least one photosensitive element in a corresponding attaching area of a circuit board panel, respectively.

placing the circuit board panel with the photosensitive element in a molding die 100, and molding a molded base panel by a molding process;

cutting the molded base panel to form individual molded photosensitive assemblies; and directly assembling an optical lens on the top portion of the molded base to form a camera module;

Further, as shown in FIG. 8, an electronic device 80 assembled with the camera module 1 provided by the present disclosure is shown, wherein the electronic device 80 is exemplified but not limited to a smart phone, a wearable device, a computer device, and a television set, a vehicle, a camera, a monitoring device, etc., and the camera module 1 cooperates with the electronic device 80 to realize image acquisition and reproduction of a target object. In order to clarify the technical advantages generated by the camera module 1 in cooperation with the electronic device 80, the electronic device 80 is a smart phone as an example. However, it should be understood by those skilled in the art that the smart phone is to only taken an example to explain the cooperation relationship and technical features between the camera module 1 and the electronic device 80. That is, in the present disclosure, the type of the electronic device 80 is not a limitation of the present disclosure.

More specifically, the smart phone includes a device main body 81 and at least a fixed-focus camera module 1 assembled in the device main body 81, wherein the fixed-focus camera module 1 serves as a front camera of the smart phone, and is assembled on the same side of the device main body 81 as the touch screen 811 of the device main body 81. That is, in the smart phone, the touch screen 811 and the camera module 1 share the same side area of the smart phone, so that by adjusting the body size and related structural parameters of the camera module 1, more room can be released to achieve the purpose of expanding the touch screen 811.

More specifically, the fixed-focus camera module 1 includes a circuit board 13, a photosensitive element 12 operatively connected to the circuit board 13, an optical lens 20, and a molded base 11, wherein the molded base 11 is integrally molded on the circuit board 13 and the photosensitive element 12, and the molded base 11 forms a light window to provide a light passage for the photosensitive element 12; and wherein the optical lens 20 is directly assembled on the top of the molded base 11 without a fixed lens barrel, so that the top of the molded base 11 does not need to provide an area for supporting the fixed lens barrel, and thereby the space for the fixed lens barrel is released. In this example, an expanded space can be provided for the touch screen 811 to achieve the purpose of increasing the screen ratio of the smart phone.

It is worth mentioning that the circuit board 13 includes a circuit board substrate 131 and a plurality of electronic components 132 disposed on the circuit board substrate, wherein the fixed-focus camera module 1 is assembled at a position adjacent to the edge of the device main body 81, and the side of the circuit board 13 adjacent to the edge of the device main body 81 is not provided with the electronic components 132, so that the distance between the fixed-focus camera module 1 and the top end edge of the device main body 81 is reduced. In this way, a larger expansion space can be further provided for the touch screen 811 of the smart phone. That is, in the present disclosure, the electronic components 132 are arranged on at least one of the remaining sides other than the side adjacent to the top end of the device main body 81.

Further, the circuit board 13 and the photosensitive element 12 are conductively connected by a group of lead wires 14, and the side adjacent to the top end of the device main body 81 along the length direction of the device main body 81 is not provided with the lead wires 14. In this way, the distance between the camera module 1 and the edge of the device main body 81 can be further reduced, so that a larger expansion space can be further provided for the touch screen 811 of the smart phone.

It is worth mentioning that the molded base 11 integrally molded on the circuit board 13 and the photosensitive element 12 is cut from the one-piece molded base 11 manufactured in a panelization process, and the side adjacent to the edge of the device main body 81 corresponds to one of the cutting sides 101.

Further, the fixed-focus camera module 1 further includes at least one filter element 40, wherein the filter element 40 is disposed on the molded base 11, and the filter element 40 is held between the optical lens 20 and the photosensitive element 12. In some embodiments of the present disclosure, the molded base 11 has at least one groove 112 on the top side, and the filter element 40 is assembled in the groove 112. In other embodiments of the present disclosure, the camera module 1 further includes a filter element lens holder 30, the filter element 40 is assembled on the filter element 40, and the filter element lens holder 30 is assembled at a corresponding position on the top side of the molded base 11 to allow the light transmitting through the optical lens 20 to be filtered by the filter element 40 and then reach the photosensitive element 12.

Figure 9A:
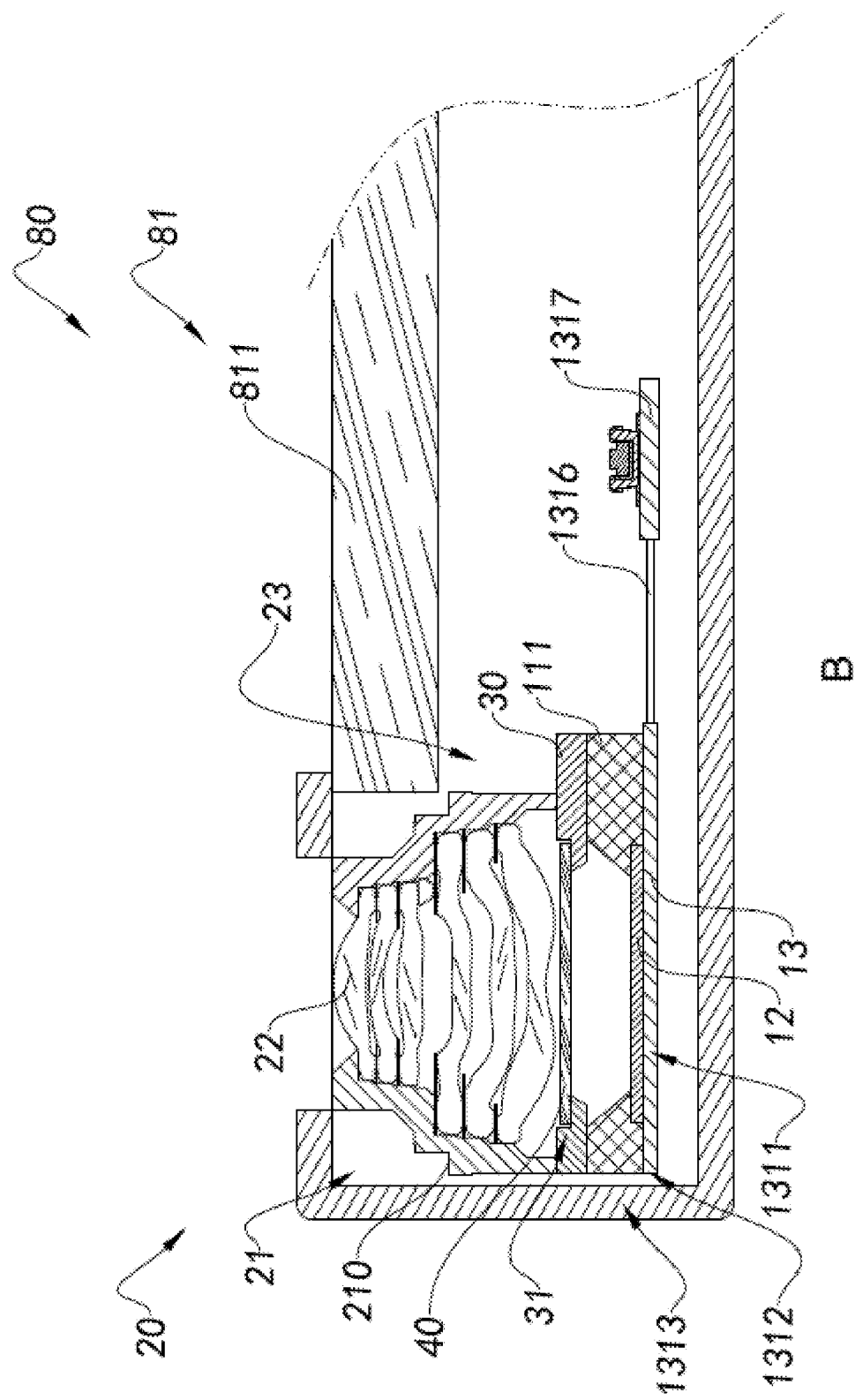
FIG. 9A is an enlarged cross-sectional view of a partial area at B according to the electronic device shown in FIG. 8.

As shown in FIG. 9A, the optical lens 20 is directly assembled on the top of the molded base 11, and the size of the optical lens 20 is smaller than that of the top of the molded base 11 to form an extension space 23 between the optical lens 20 and the molded base 11. In the process of assembling the camera module 1 in the smart phone, the touch screen 811 of the smart phone can further extend into the extension space 23, so that without changing the surface size of the smart phone, the purpose of expanding the display screen of the smart phone and increasing the "screen ratio" may be further achieved.

Figure 9B:
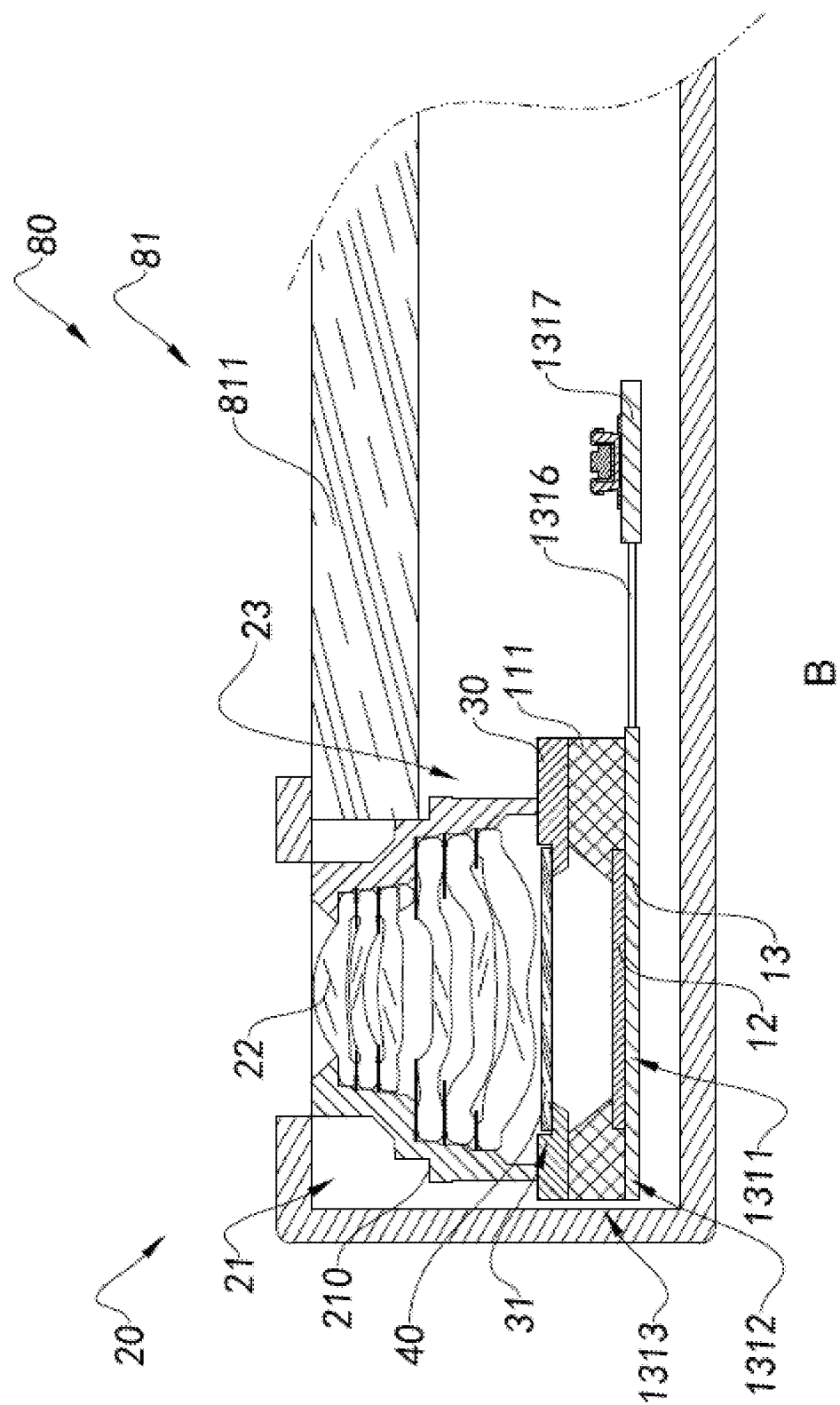
FIG. 9B is an enlarged cross-sectional view of a partial area at B in a modified embodiment according to the electronic device shown in FIG. 8.

As shown in FIG. 9B, the lens barrel unit 21 further has a stepped portion, and the stepped portion extends inwardly along the optical axis direction defined by the optical lens 20 to further expand the extension space 23 by the stepped portion. That is, in the process of assembling the camera module 1 to the smart phone, the display screen 811 of the smart phone can be further extended to the shoulder of the stepped portion of the lens barrel unit 21. In this way, the purpose of expanding the display screen of the smart phone and improving the "screen ratio" may be further achieved.

It is also worth mentioning that the optical lens 20 may be an integral lens or a split lens, which includes at least two lens units, the lens units being assembled in cooperation with each other to form the optical lens 20. In the present disclosure, the type of the optical lens 20 is not limited.

It should be understood by those skilled in the art that the embodiments of the present disclosure described in the above description and illustrated in the accompanying drawings are only exemplary and not limiting to the present disclosure. The objectives of the present disclosure have been achieved completely and efficiently. The function and structural principles of the present disclosure have been shown and described in the embodiments, and the implementations of the present disclosure may be varied or modified without departing from the principles.

What is claimed is:

1. A fixed-focus camera module, suitable for assembly in an electronic device, comprising:
    a circuit board;
    a photosensitive element, which is conductively connected to the circuit board;
    a molded base, wherein the molded base is integrally molded on the circuit board and the photosensitive element, and the molded base forms a light window, so as to provide a light passage for the photosensitive chip through the light window; and
    an optical lens, wherein the optical lens is supported on the top side of the molded base and corresponds to the light window formed by the molded base, wherein the circuit board comprises a circuit board substrate and at least one electronic component, wherein the at least one electronic component is electrically connected to the circuit board substrate, wherein the circuit board substrate has a blank side and a flexible board connection side opposite to the blank side, and when the fixed-focus camera module is assembled in the electronic device, the blank side of the circuit board substrate is adjacent to the edge of the electronic device, and wherein the blank side of the circuit board substrate is free of the at least one electronic component;
    wherein the optical lens comprises a lens barrel unit and a group of optical lens sheets, and the optical lens sheets are supported in the lens barrel unit, and a bottom of the lens barrel unit is disposed on the molded base;
    wherein the width of the lens barrel unit is smaller than the width of the molded base, so as to define an extension space by the optical lens and the molded base, wherein when the fixed-focus camera module is assembled in the electronic device, the extension space is used to receive a display screen of the electronic device;
    wherein the lens barrel unit has a stepped portion, wherein the stepped portion is above the molded base and extends inwardly toward an optical axis direction set by the optical lens and is configured to receive at least a portion of the display screen of the electronic device, so as to increase the extension space by means of the stepped portion;
    wherein the fixed-focus camera module further comprises a filter element lens holder, wherein the filter element lens holder is disposed on the molded base, and is used for mounting the filter element, and the filter element lens holder has a hollow portion corresponding to the filter element, so that the filter element is held in the light passage of the photosensitive element, wherein the thickness of the filter element lens holder at the blank side is smaller than the thickness of the filter element lens holder at the flexible board connection side;
    wherein the optical lens is supported partially by both the filter element lens holder and the molded base, wherein the optical lens has a first bottom side and a second bottom side which are opposite each other, wherein the first bottom side is at the blank side and supported by the molded base, and the second bottom side is at the flexible board connection side and supported by the filter element lens holder.

2. The fixed-focus camera module of claim 1, wherein the circuit board substrate further has two wing sides, wherein the two wing sides each extend between the flexible board connection side and the blank side, and wherein the at least one electronic component is disposed on at least one of the two wing sides of the circuit board substrate.

3. The fixed-focus camera module of claim 1, wherein the circuit board substrate further has a flexible board connection side and two wing sides, wherein the flexible board connection side is opposite to the blank side, and the two wing sides each extend between the flexible board connection side and the blank side, and wherein the at least one electronic component is disposed on at least one of the two wing sides and the flexible board connection side of the circuit board substrate.

4. The fixed-focus camera module of claim 1, wherein the circuit board substrate further has a flexible board connection side and two wing sides, wherein the flexible board connection side is opposite to the blank side, and the two wing sides each extend between the flexible board connection side and the blank side, and wherein the at least one electronic component is disposed on one of the two wing sides and the flexible board connection side of the circuit board substrate.

5. The fixed-focus camera module of claim 2, wherein the width of the blank side of the circuit board substrate is smaller than the width of the flexible board connection side opposite to the blank side.

6. The fixed-focus camera module of claim 5, wherein the molded base is integrally molded on the circuit board and the photosensitive element, and covers at least a part of the circuit board, at least a part of the photosensitive element and the at least one electronic component.

7. The fixed-focus camera module of claim 1, wherein the width of the lens barrel unit is greater than the width of the light window of the molded base, and wherein the lens barrel unit is disposed across the light window and is supported on the top side of the molded base.

8. The fixed-focus camera module of claim 1, wherein the edge of the lens barrel unit located on the blank side of the circuit board substrate is aligned with the edge of the blank side of the circuit board substrate.

9. The fixed-focus camera module of claim 8, wherein the optical lens sheet located on the topmost side of the lens barrel unit is a glass lens sheet.

10. The fixed-focus camera module of claim 1, wherein the fixed-focus camera module further comprises a filter element, and the filter element is held in the light passage of the photosensitive element.

11. The fixed-focus camera module of claim 10, wherein the top side of the molded base has a groove, and the filter element is assembled in the groove so that the filter element is held in the light passage of the photosensitive element.

12. The fixed-focus camera module of claim 10, wherein the filter element lens holder is used for mounting the filter element so that the filter element is held in the light passage of the photosensitive element.

13. The fixed-focus camera module of claim 12, wherein the top side of the molded base has a groove, and the filter element lens holder is mounted in the groove of the molded base for mounting the filter element thereon.

14. The fixed-focus camera module of claim 12, wherein the optical lens is attached to the filter element lens holder to be held on the top side of the molded base and correspond to the light window formed by the molded base.

15. The fixed-focus camera module of claim 13, wherein the depth of the groove is consistent with the height of the filter element lens holder, so that the top surface of the filter element lens holder is aligned with the top surface of the molded base.

16. The fixed-focus camera module of claim 15, wherein the optical lens is simultaneously attached to the filter element lens holder and the molded base, so that the optical lens is held on the top side of the molded base and corresponds to the light window formed by the molded base.

17. The fixed-focus camera module of claim 10, further comprising a limit protrusion, wherein the limit protrusion is circumferentially and convexly extended upwardly from the filter element lens holder for limiting the optical lens within the limit protrusion.

18. An electronic device, comprising:
an electronic device body; and
a fixed-focus camera module, comprising:
a circuit board;
a photosensitive element, which is conductively connected to the circuit board;
a molded base, wherein the molded base is integrally molded on the circuit board and the photosensitive element, and the molded base forms a light window, so as to provide a light passage for the photosensitive chip through the light window; and
an optical lens, wherein the optical lens is supported on the top side of the molded base and corresponds to the light window formed by the molded base, wherein the circuit board comprises a circuit board substrate and at least one electronic component, wherein the at least one electronic component is electrically connected to the circuit board substrate, wherein the circuit board substrate has a blank side and a flexible board connection side opposite to the blank side, and wherein the fixed-focus camera module is assembled in the electronic device body, wherein when the fixed-focus camera module is assembled in the electronic device, the blank side of the circuit board substrate is adjacent to the edge of the electronic device, and wherein the blank side of the circuit board substrate is free of the at least one electronic component;
wherein the optical lens comprises a lens barrel unit and a group of optical lens sheets, and the optical lens sheets are supported in the lens barrel unit, and a bottom of the lens barrel unit is disposed on the molded base;
wherein the width of the lens barrel unit is smaller than the width of the molded base, so as to define an extension space by the optical lens and the molded base, wherein when the fixed-focus camera module is assembled in the electronic device, the extension space is used to receive a display screen of the electronic device;
wherein the lens barrel unit has a stepped portion, wherein the stepped portion is above the molded base and extends inwardly toward an optical axis direction set by the optical lens and is configured to receive at least a portion of the display screen of the electronic device, so as to increase the extension space by means of the stepped portion;
wherein the fixed-focus camera module further comprises a filter element lens holder, wherein the filter element lens holder is disposed on the molded base, and is used for mounting the filter element, and the filter element lens holder has a hollow portion corresponding to the filter element, so that the filter element is held in the light passage of the photosensitive element, wherein the thickness of the filter element lens holder at the blank side is smaller than the thickness of the filter element lens holder at the flexible board connection side;
wherein the optical lens is supported partially by both the filter element lens holder and the molded base, wherein the optical lens has a first bottom side and a second bottom side which are opposite each other, wherein the first bottom side is at the blank side and supported by the molded base, and the second bottom side is at the flexible board connection side and supported by the filter element lens holder.

* * * * *